United States Patent
Chen et al.

(10) Patent No.: US 7,211,199 B2
(45) Date of Patent: May 1, 2007

(54) MAGNETICALLY-AND ELECTRICALLY-INDUCED VARIABLE RESISTANCE MATERIALS AND METHOD FOR PREPARING SAME

(75) Inventors: I-Wei Chen, Swarthmore, PA (US); Alexander Mamchik, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 244 days.

(21) Appl. No.: 10/390,362

(22) Filed: Mar. 17, 2003

(65) Prior Publication Data

US 2004/0036571 A1    Feb. 26, 2004

Related U.S. Application Data

(60) Provisional application No. 60/364,915, filed on Mar. 15, 2002.

(51) Int. Cl.
*G11B 5/39* (2006.01)
*H01L 43/00* (2006.01)
*H01L 39/12* (2006.01)

(52) U.S. Cl. .................. 252/62.2; 252/62.57; 252/500; 252/518.1; 338/32 R; 257/295; 257/427; 428/392; 428/900; 360/313

(58) Field of Classification Search .............. 252/502, 252/518.1, 519, 62.51 R, 512; 502/302, 502/303, 525; 360/313; 365/50, 87, 145, 365/148, 158, 189.03; 338/22 R; 438/3, 438/385; 257/295–299, 595; 505/191, 701
See application file for complete search history.

(56) References Cited

U.S. PATENT DOCUMENTS

| | | | |
|---|---|---|---|
| 3,330,697 A | | 7/1967 | Pechini |
| 3,897,367 A | * | 7/1975 | Lauder ........................ 502/303 |
| 4,814,107 A | * | 3/1989 | Steinberg .................... 252/512 |
| 5,759,434 A | | 6/1998 | Shimakawa et al. |
| 5,939,354 A | * | 8/1999 | Golden ........................ 502/302 |
| 5,977,017 A | | 11/1999 | Golden et al. |
| 6,204,139 B1 | | 3/2001 | Liu et al. |
| 6,403,441 B1 | * | 6/2002 | Takehiro et al. ............ 438/396 |

(Continued)

FOREIGN PATENT DOCUMENTS

WO    PCT/IB00/0043    8/2000

OTHER PUBLICATIONS

Gausepohl et al, "Magnetoresitance properties of thin films of the metallic oxide of ferromagnet SrRuO3," Phys. Rev.B., 1995, 52(5), pp. 3459-3465.*

(Continued)

*Primary Examiner*—Mark Kopec
*Assistant Examiner*—Kallambella Vijayakumar
(74) *Attorney, Agent, or Firm*—Evelyn H. McConathy, Esq.; Montgomery, McCracked, Walker & Rhoads, LLP

(57) ABSTRACT

Provided are new compositions of ruthenates in the pervoskite and layered pervoskite family, wherein the ruthenate compositions exhibit large magnetoresistance (MR) and electric-pulse-induced resistance (EPIR) switching effects, the latter observable at room temperature. This is the first time large MR and EPIR effects have been shown together in ruthenate compositions. Further provided are methods for synthesizing the class of ruthenates that exhibits such properties, as well as methods of use therefor in electromagnetic devices, thin films, sensors, semiconductors, insulators and the like.

28 Claims, 14 Drawing Sheets

U.S. PATENT DOCUMENTS 6,473,332 B1    10/2002    Ignatiev et al.
2002/0030945 A1*   3/2002    Odagawa et al. ........... 360/313

OTHER PUBLICATIONS

Battle, P.D., Gibb, T.C., Jones, C.W., and Studer, F., "Spin-glass behavior in $Sr_2FeRuO_6$ and $BaLaNiRuO_6$: A comparison with antiferromagnetic $BaLaZnRuO_6$," *J. Solid State Chem.* 78:281-293 (1989).

Beck, A., J.G. Bednorz, Ch. Gerber, C. Rossel and D. Widmer, "Reproducible switching effect in thin oxide films for memory applications," *Appl. Phys. Lett.* 77(1):139-141 (2000).

Choi, J., C. B. Eom, G. Rijinders, H. Rogalla, and R. H. A. Blank, "Growth mode from layer by layer to step flow during the growth of heteroepitaxial $SrRuO_3$ on (001) $SrTiO_3$," *Appl. Phys. Lett.* 79:1447-1449 (2001).

Eom, C.B., R. B. Van Dover, J. M. Phillips, D. J. Werder, J. H. Marshall, C. H. Chen, R. Cava, J. R. M. Fleming, D. and K. Fork, "Fabrication and properties of epitaxial ferroelectric heterostructures with $SrRuO_3$ isotropic metallic oxide electrodes," *Appl. Phys. Lett.* 63:2570-2572 (1993).

Eom, C.B., R. J. Cava, R. M. Fleming, J. M. Phillips, R. B. Van Dover, J. H. Marshall, J. Hsu, W.P., J. J. Krajewski, W. F. and Peck, Jr., "Single-crystal epitaxial thin films of the isotropic metallic oxides $Sr_{1-x}Ca_xRuO_3$ (x between 0 and 1)," *Science* 258:1766-1769 (1992).

Gausephol, S.C., M. Lee, K. Char, R. A. Rao, and C. B. Eom, "Magnetoresistance properties of thin films of the metallic oxide ferromagnet $SrRuO_3$," *Phys. Rev.* B52:3459-3462 (1995).

Hamada, N., H. Sawada, and K. Terakura, in *Spectroscopy of Mott Insulators and Correlated Metals*, (eds. A. Fujimori and Y. Tokura), Springer, Berlin 119:95-105 (1995).

He, T., and R. J. Cava, "Disorder-induced ferromagnetism in $CaRuO_3$," *Phys. Rev.* B63:172403-1-172403-4 (2001).

He, T., and R. J. Cava, "The effect of Ru-site dopants on the magnetic properties of $CaRuO_3$," *J. Phys.: Condens. Matter* 13:8347-8361 (2001).

Kim, S.H., and P. D. Battle, "Structural and electronic properties of the mixed co-ru perovskites $AA'CoRuO_6(A,A'=Sr, Ba, La)$," *J. Solid State Chem.* 114:174-183 (1995).

Klein, L., A.F. Marshall, J.W. Reiner, C.H. Ahn, T.H. Geballe, M.R. Beasley, and A. Kapitulnik, "Large magenetoresistance of single-crystal films of ferromagnetic $SrRuO_3$," *J. Magn. Mater.* 188:319-325 (1998).

Kobayashi, K.I., T. Kimura, H. Sawada, K. Terakura, Y. Tokura, "Room-temperature magnetoresistance in an oxide material with an ordered double-perovskite structure," *Nature* 395:677-680 (1998).

Liu, S.Q., N.J. Wu, and A. Ignatiev, "Electric-pulse-induced reversible resistance change effect in magnetoresistive films," *Applied Physics Letters*, 76(19): 2740-2752 (2000).

Longo, J.M., P. M. Raccah, and J. B. Goodenough, "Magnetic properties of $SrRuO_3$ and $CaRuO_3$," *J. Appl. Phys.* 39:1327-1328 (1968).

Maeno, Y., H. Hashimoto, K. Yoshida, S. Nishizaki, T. Fujita, J. G. Bednorz, and F. Lichtenberg, "Superconductivity in a layered perovskite without copper," *Nature* 372:532-534 (1994).

Mamchik, A., and I-W. Chen, "Large magnetoresistance in magnetically frustrated ruthenate perovskites," *Appl. Phys. Lett.*, 82: 613-615 (2003).

Mazin, I., and D. J. Singh, "Electronic structure and magnetism in Ru-based perovskites," *Phys. Rev.* B56:2556-2571 (1997).

I. Mazin, D. A. Papaconstantopoulos, and D. J. Singh, "Tight-binding hamiltonians for Sr-filled ruthenates: application to the gap anistropy and hall coefficient in $Sr_2RuO_4$," *Phys. Rev.* B61:5223-5228 (2000).

Ramirez, A.P., "Colossal magnetoresistance," *J. Phys.: Condens. Matter* 9:8171-8199 (1997).

Raveau, B, A. Maignan, C. Martin, and M. Hervieu, "Ru doping of perovskite manganites: an effective route to ferromagnetism, metallicity, and CMR," *J. Supercond.* 14:217-229 (2001).

Rossel, C., G.I. Meijer, D. Bremaud and D. Widmer, "Electrical current distribution across a metal-insulator-metal structure during bistable switching," *J. Appl. Phys.* 90(6):2892-2898 (2001).

Tiwari, P., X. D. Wu, S. R. Foltyn, M. Q. Le, I. H. Campbell, R. C. Dye, and R. E. Muenchausen, "Epitaxial $YBa_2Cu_3O_{7-delta}$ thin-films on $SrRuO_3/Pt/MgO$," *Appl. Phys. Lett.* 64:634-636 (1994).

Y. Watanabe, J.G. Bednorz, A. Bietsch, Ch. Gerber, D. Widmer, A. Beck and S.J. Wind, "Current-driven insulator-conductor transition and nonvolatitle memory in chromium-doped $SrTiO_3$ single crystals," *Appl. Phys. Lett.* 78(23):3738-3740 (2001).

\* cited by examiner

MAGNETICALLY- AND ELECTRICALLY-INDUCED VARIABLE RESISTANCE MATERIALS AND METHOD FOR PREPARING SAME

CROSS REFERENCE TO RELATED APPLICATIONS

This application claims priority to U.S. Provisional Application No. 60/364,915 filed Mar. 15, 2002, which is incorporated herein in its entirety.

GOVERNMENT INTEREST

This invention was supported in part by Grant Nos. DMR 00-79909 and DMR 99-88853 from the National Science Foundation. Accordingly, the Government may have certain rights in this invention.

FIELD OF THE INVENTION

The present invention relates to a new class of magnetically and electrically induced variable resistance materials having a large magnetoresistance effect (MR) and a large electric-pulse-induced resistance switching effect (EPIR), and a method for preparing said materials.

BACKGROUND OF THE INVENTION

Magnetoresistance (MR) effects are utilized to detect variations within a magnetic field by converting into variations of resistance. Materials that exhibit MR effect also often exhibit spin-polarization ability. Therefore, they can form spin valves to transmit signals based on spin polarization. Recent advances in data storage technologies have been based upon the use of multilayer metallic thin films that exhibit giant magnetoresistance (GMR) (e.g., U.S. Pat. No. 5,977,017 (Golden et al.)). MR-based devices, e.g., magnetoresistors, magnetic heads to detect signals of a magnetic recorder, or probes of a spin-polarized scanning type tunneling microscope, have the advantage of high immunity to radiation damage. Thus, data storage is indestructible, even under adverse operating or storage conditions.

Oxides are known to have large MR properties. In a class of oxide materials called manganates (see below), such large MR has been termed colossal magnetoresistance (CMR). (Ramirez, *J. Phys.: Condens. Matter* 9:8171–8199 (1997)). CMR is also commonly used to refer to the large MR observed in similar oxides as manganates when cobalt is used to replace manganese, called cobatates.

In addition to the large MR effect, oxides are also known to exhibit electric-pulse induced resistance (EPIR) properties. (Liu et al., *Appl. Phys. Lett.* 76(19):2740–2752 (2000)). EPIR switching effects are utilized to permanently change resistance, until a reverse electrical pulse is applied. Liu et al. teach a method for switching the properties of perovskite materials used in thin film resistors by applying short electrical pulses to change (both reversibly and non-reversibly) the electrical, thermal, mechanical and magnetic properties of the material without damaging it (Liu et al., *Appl. Phys. Lett.* 76:2749–2751 (1999); U.S. Pat. No. 6,204,139). This permits the formation of memory devices and resistors in electronic circuits that can be varied in resistance. Materials exhibiting an EPIR effect are useful as non-volatile, rewritable memory cells to store information in microelectronic devices. For example, U.S. Pat. No. 6,473,332 (Ignatiev et al.) teaches an electrically operated, overwritable, multivalued, non-volatile resistive memory element that includes a two terminal non-volatile memory device using CMR oxide film material and a defined circuit topological configuration that takes advantage of the variable EPIR effect of the thin film material.

For the purpose of the present application, perovskite compositions refer to the formula $ABO_3$, in which A represents a metal that may be drawn from alkali, alkali earth, rare earth, or other metal such as potassium, strontium, lanthanum, neodymium, cerium, yttrium, lead, bismuth or the like, and B represents a transition metal such as cobalt, iron, nickel, or the like. (Perovskite actually can have even broader compositions for metal substitution, as will become clear later in the following description.) Perovskite-type materials have long been known to be useful for the catalytic oxidation and reduction reactions associated with the control of automotive exhaust emissions (U.S. Pat. No. 4,107,163 (Donohue)), but the electrical conductivity charateristics of the material are more recently discovered, such as the CMR effect observed in manganites, when B represents manganese (Mn), and cobatates, when B represents cobalt (Co) (Ramirez, 1997). Kobayashi et al., also made various studies on other, non-Mn and non-Co, ordered perovskite oxide crystals and identified a MR phenomenon, permitting the development of a magnetoresistor that is an oxide crystal with an ordered double perovskite crystal structure (Kobayashi et al., *Nature* 395:677–680 (1998); U.S. Pat. No. 6,137,395). (See below on $Sr(Fe_{0.5}Mo_{0.5})O_3$ and $Sr(Fe_{0.5}Re_{0.5})O_3$).

As made clear from above, for the purpose of the present application, manganates refer to a known class of perovskite oxides in which B represents manganese (Mn). Many manganates have CMR properties. Consequently, upon application of a magnetic field, the electrical resistivity of the material drops drastically due to a field-induced switching of the crystal structure. However, manganate MR is limited to a certain temperature range in which the magnetic field can promote (or in some compounds induce) a phase transition. The resistance response to the magnetic field is often hysteretic, in that a different resistance is found at the same magnetic field depending on the history of the field, such as whether the field has been increasing or decreasing. In addition, there is significant 1/f noise associated with circuits comprising manganate MR materials. It is generally accepted that in perovskite compositions, manganese may be held in both the trivalent $Mn^{3+}$ state and the tetravalent $Mn^{4+}$ state, and that such mixed valency is an essential element for the phase transition and the resultant large MR properties of the compound. Very similar mixed valency also exists in cobatates that exhibit CMR effect.

Some manganates and cobaltates exhibit both CMR and EPIR effects. Generally, most EPIR effects were observed in thin films, across which a large electrical field may be achieved using a relatively modest electrical voltage. For example, Liu et al. describes such effect in CMR ($Pr_{0.7}Ca_{0.3}$)$MnO_3$ thin films. (Liu, 2000). In the patent of Liu et al. (U.S. Pat. No. 6,204,139), an additional cobaltate of a metal composition $Gd_{0.7}Ca_{0.3}BaCo_2$ was described as having EPIR properties. According to Liu et al (U.S. Pat. No. 6,204,139 B1), other oxide materials of the perovskite-related families that exhibit EPIR effect include $YBa_2Cu_3O_7$ which is also known to possess high Tc superconductivity.

Mixed valency also appears to be important for the EPIR effect. The manganate that is best known for having the EPIR effect, $(Pr_{0.7}Ca_{0.3})MnO_3$, contains 70% $Mn^{3+}$ and 30% $Mn^{4+}$. Both cobaltateand the high Tc superconductor described above are known to have mixed valency. However, at least in the case of manganates, a disadvantage of such mixed valency is that manganates are sensitive to surface conditions. As a result, Mn ions at a surface that is exposed to air, vacuum, or other atmospheric or liquid environment, or at the interface that is adjacent to another solid material, can have different degrees of mixed valency distinct from those in the interior, depending on the moisture and chemical nature of the environment. As a result of such sensitivity, the magnetic (MR) and electrical (EPIR) responses of the resistivity are sometimes difficult to control or predict. In addition, mixed valency is sensitive to radiation, laser illumination, and other non-magnetic and non-electrical stimuli, which could also affect the magnitude of the observed MR and EPIR effect.

Several other families of oxides are also known to exhibit large MR effects, or large EPIR effects, but not both. One family of oxides that have been known to have large MR properties is based on the composition $Sr(Fe_{0.5}Mo_{0.5})O_3$ mentioned previously, which also has a perovskite-type structure $ABO_3$. In this case, however, B is comprised, in equal parts, of Fe and Mo, which are ordered. Thus Fe and Mo are located on alternating sites in a checkerboard type of arrangement. The MR capability of this material results from a tunneling effect across grain boundaries. Therefore, substantial magnetoresistance is lost when $Sr(Fe_{0.5}Mo_{0.5})O_3$ is formed into a single crystal or an epitaxial film. It is believed that a 1:1 ordered cation arrangement is important for its magnetoresistance properties. However, disadvantageously, Mo in the above compound has a valence state of $Mo^{5+}$, as opposed to the more common $Mo^{6+}$ state, therefore a careful preparation under a reducing atmosphere or vacuum is required to form such compounds. Another ordered perovskite, $Sr(Fe_{0.5}Re_{0.5})O_3$, reportedly exhibits similar MR properties, and suffers from the same limitations. These compounds are not known to exhibit EPIR effect.

By comparison, Beck et al., have claimed a large number of oxide families that reportedly exhibit EPIR effect (PCT application, PCT/IB00/0043)). However, the examples in the PCT application and publications by the same group of researchers at IBM Zurich reveal that only the following oxides demonstrated the claimed EPIR effect: doped $Ba_{1-x}Sr_xTiO_3$, when doped with p-type (chromium or manganese) or n-type (vanadium or niobium) dopants; chromium-doped $SrZrO_3$, doped $Ca_2Nb_2O_7$ and doped $Ta_2O_5$ with chromium or vanadium as dopants (see, Beck et al., Appl. Phys. Lett. 77(1):139–141 (2000); Watanabe et al., Appl. Phys. Lett. 78(23):3738–3740 (2001); Rossel et al., J. Appl. Phys. 90(6):2892–2898 (2001)). Earlier reports also indicated that $Al_2O_3$, $Nb_2O_5$, $TiO_2$, $Ta_2O_5$ and NiO may exhibit memory behavior based on current-induced bistable resistance switching or voltage-controlled negative resistance phenomena (see references cited by Beck et al., 2000). None of the cited materials, however, exhibit a large MR effect.

Many ruthenate oxides, on the other hand, are known to be excellent conductors. For example, strontium ruthenate ($SrRuO_3$), which is also a perovskite, is often used as a bottom electrode material in electronic devices (Eom et al., Science 258:1766–1769 (1992); Eom et al., Appl. Phys. Lett. 63:2570–2572 (1993); Tiwari et al., Appl. Phys. Lett. 64:634–636 (1994); Klein et al., J. Magn. Mater. 188: 319–325 (1998); FIG. 1 of PCT/IB00/00043). $SrRuO_3$ itself is metallic and ferromagnetic (Longo et al., J. Appl. Phys. 39:1327–1328 (1968)), which is unique among 4d transition metal oxides. It has a very small (0.5–4%) MR, restricted to a narrow temperature range near the ferromagnetic/paramagnetic transition temperature. When $SrRuO_3$ electrodes were used in place of the Pt layer in $Pb(Zr,Ti)O_3$-based ferroelectric memory devices, they alleviated the problem of polarization fatigue (Eom et al., 1993). It is, however, not known to have EPIR effect.

The $ABO_3$ perovskite structure of $SrRuO_3$ also makes it compatible with other similar compounds, allowing its incorporation as an epitaxial thin film or buffer layer in heteroepitaxial device structures built on perovskite oxides (Tiwari et al., 1994). Further, substitution of Ru by other transition metal ions (Mn, Fe, Co, etc.) has been reported to create new magnetic properties, ranging from colossal magnetoresistance (e.g., in Sm, $Ca(Ru,Mn)O_3$, with Ru in amount considerably less than Mn) (Raveau et al., J. Supercond. 14:217–229 (2001)) to spin glass behavior (e.g., in $Sr(Fe_{0.5}Ru_{0.5})O_3$) (Battle et al., J. Solid State Chem. 78:281–293 (1989)). Related Ru-based compounds further display an exceptionally rich variety of electronic and magnetic properties, ranging from paramagnetic (e.g., in $CaRuO_3$) to superconducting (e.g., in $Sr_2RuO_4$) while retaining metallicity (Longo et al., 1968; Maeno et al., Nature 372:532–534 (1994)). None of these Ru-based compounds or transition-metal substituted ruthnates are known to have EPIR effect.

Another ruthenate composition, TlSrRuO (Tl:Sr:Ru at a ratio of 1:2:1), which is believed to have a layered structure that is derived from perovskite, were reported to have magnetic transitions (e.g., U.S. Pat. No. 5,759,434 (Shimakawa et al.)). As a result, magnetoresistance in the vicinity of the transitions have been observed. This material is highly toxic, however, because of the presence of Tl. It is also not known to have EPIR effect.

A review of the ruthenate literature reveals that no EPIR effect has been reported, but considerable difficulties have been encountered in synthesizing these compounds. Consequently, highly uniform materials free of second phases or heterogeneous clusters are difficult to obtain using standard solid state reactions of mixed starting oxide powders. Often, very long calcination and/or laborious regrinding and remixing is needed, especially when two B-site cations are desired in the resulting compound (Battle et al., 1989; Kim et al., J. Solid State Chem. 114:174–183 (1995); He et al., Phys. Rev. B63:172403 (2001)). It is also known that even minor second phases and small heterogeneous clusters can have a considerable effect on the magnetic and electrical properties of these compounds (Kim et al., 1995; He et al., 2001).

Accordingly, there has, until the present invention, existed a need for commercially useful material exhibiting both MR and EPIR properties, that is non-toxic and easily integrable with electrode and other materials for device applications, without suffering from drawbacks, such as sensitivity to surface environment. High purity ruthenate perovskites might satisfy that need if they, and their related compounds, were not so difficult to form by conventional ceramic processing routes using mixed starting oxide powders and solid state reactions. Thus, there has been a further need, until the present invention, for a production method for synthesizing chemically uniform ruthenates and doped ruthenates that exhibit both large MR and EPIR effects, wherein the method significantly reduces the processing time and results in excellent compositional uniformity, as verified by diffraction and magnetic measurements.

SUMMARY OF THE INVENTION

The present invention teaches new compositions of ruthenates that exhibit large magnetoresistance (MR) and electric-pulse-induced resistance (EPIR) switching effects, the latter observable at room temperature. This is the first time that both large MR and EPIR effects have been reported together in ruthenates in the pervoskite- and layered pervoskite-related family of compounds. Previously, no composition having a majority of ruthenium (no less than 50% in B) were known to have large MR. The present invention, therefore, also teaches methods for synthesizing this large class of ruthenates in the perovskite-related family that exhibits such properties. Since the applications of both MR and EPIR require the use of an electrode, whereas $SrRuO_3$ and several other ruthenates are already recognized as excellent electrode materials, ruthenate electrodes and MR or EPIR-active ruthenate films or devices can be advantageously constructed. These constructions have the additional advantage of structural and chemical compatibility. At ambient conditions, ruthenates are also chemically stable and do not suffer from varied valence states according to the surface environment.

It is, therefore, an object of the invention to provide a nontoxic, magnetically and electrically induced variable resistance composition comprising a ruthenate formulation of the perovskite family of materials, wherein the ruthenate exhibits large MR. It is a further object to provide a nontoxic, magnetically and electrically induced variable resistance composition comprising a ruthenate formulation of the perovskite family of materials, wherein the ruthenate exhibits an EPIR switching effect. Moreover, it is a preferred object to provide a nontoxic, magnetically and electrically induced variable resistance composition comprising a ruthenate formulation of the perovskite family of materials, wherein the ruthenate exhibits both large MR and an EPIR switching effect. The large MR effect occurs over a broad range of temperatures.

It is also an object to provide compositions comprising an oxide formulation represented by $A(Ru_{1-x}M_x)O_3$, where $0<x<1$, M is selected from the group consisting of magnetic elements; A is selected from the group consisting of K, Ca, Sr, Ba, Pb, Bi, La, Ce, Pr, Nd, Pm, Sm, Eu, Gd, Tb and Y, as well as mixtures thereof. Preferably, $0.5<x<0.9$; more preferably $0.01<x<0.5$. In an alternative embodiment of the foregoing, elements such as Sc, Y, Zr, Nb, Hf, Ta, Al, Ga, Ge and Sn are incorporated into M in the minority to vary the magnitude of electrical resistance. Moreover, in preferred embodiments the magnetic elements M are selected from the group consisting of Ti, V, Cr, Mn, Fe, Co and Ni, as well as any mixture thereof.

It is another object to provide compositions comprising a spin glass formulation represented by $A_{n+1}(Ru_{1-x}M_x)_nO_{3n+1}$, where n is any positive integer, $0<x<1$, M is selected from the group consisting of magnetic elements; A is selected from the group consisting of K, Ca, Sr, Ba, Pb, Bi, La, Ce, Pr, Nd, Pm, Sm, Eu, Gd, Tb and Y, as well as any mixture thereof. Preferably, $0.5<x<0.9$; more preferably $0.01<x<0.5$. It is also an object to provide compositions having the formula $A_2(Ru_{1-x}M_x)O_4$. In alternative embodiments of the foregoing, minority elements, such as Sc, Y, Zr, Nb, Hf, Ta, Al, Ga, Ge and Sn are incorporated into M in minority to vary the magnitude of electrical resistance. As indicated in the formulas described above, in preferred embodiments the magnetic elements M are selected from the group consisting of Ti, V, Cr, Mn, Fe, Co and Ni, as well as any mixture thereof.

Ruthenates of the above compositions, and their structural families, are advantageously used in accordance with the invention in microelectronic or optical devices, such as, but without limitation, magnetic sensors, a thin film between metals, or semiconductors, or insulators, or oxides, or any combination of the above, which take advantage of, or benefit from, the MR or EPIR properties of the provided ruthenates.

Compared to solid state reactions using mixed starting oxides, the solution-polymerization method significantly decreases the processing time and improves the compositional uniformity of the ruthenate compounds. The method especially offers a clear advantage in processing doped ruthenate compounds, allowing magnetic properties of new ruthenates to be sensitively studied without the complication of impurity phases or inhomogeneous clusters. Accordingly, it is a further object of the invention to provide a method of preparing a nontoxic, magnetically and electrically induced variable resistance ruthenate compositions of the types described above, comprising preparing a ruthenate solution and processing said solution by a sol gel solution-polymerization method, such that there is a uniform and homogeneous distribution of source cations that were chelated in the subsequently polymerized precursor. The composition is preferably of may be of polycrystalline or mixed ruthenate form, wherein the polycrystalline form is of the formula $SrRuO_3$, and wherein the starting material comprises $RuO_2$.

Additional objects, advantages and novel features of the invention will be set forth in part in the description, examples and figures which follow, all of which are intended to be for illustrative purposes only, and not intended in any way to limit the invention, and in part will become apparent to those skilled in the art on examination of the following, or may be learned by practice of the invention.

BRIEF DESCRIPTION OF THE DRAWINGS

The foregoing summary, as well as the following detailed description of the invention, will be better understood when read in conjunction with the appended drawings. It should be understood, however, that the invention is not limited to the precise arrangements and instrumentalities shown.

DESCRIPTION OF PREFERRED EMBODIMENTS OF THE INVENTION

Figure 1:
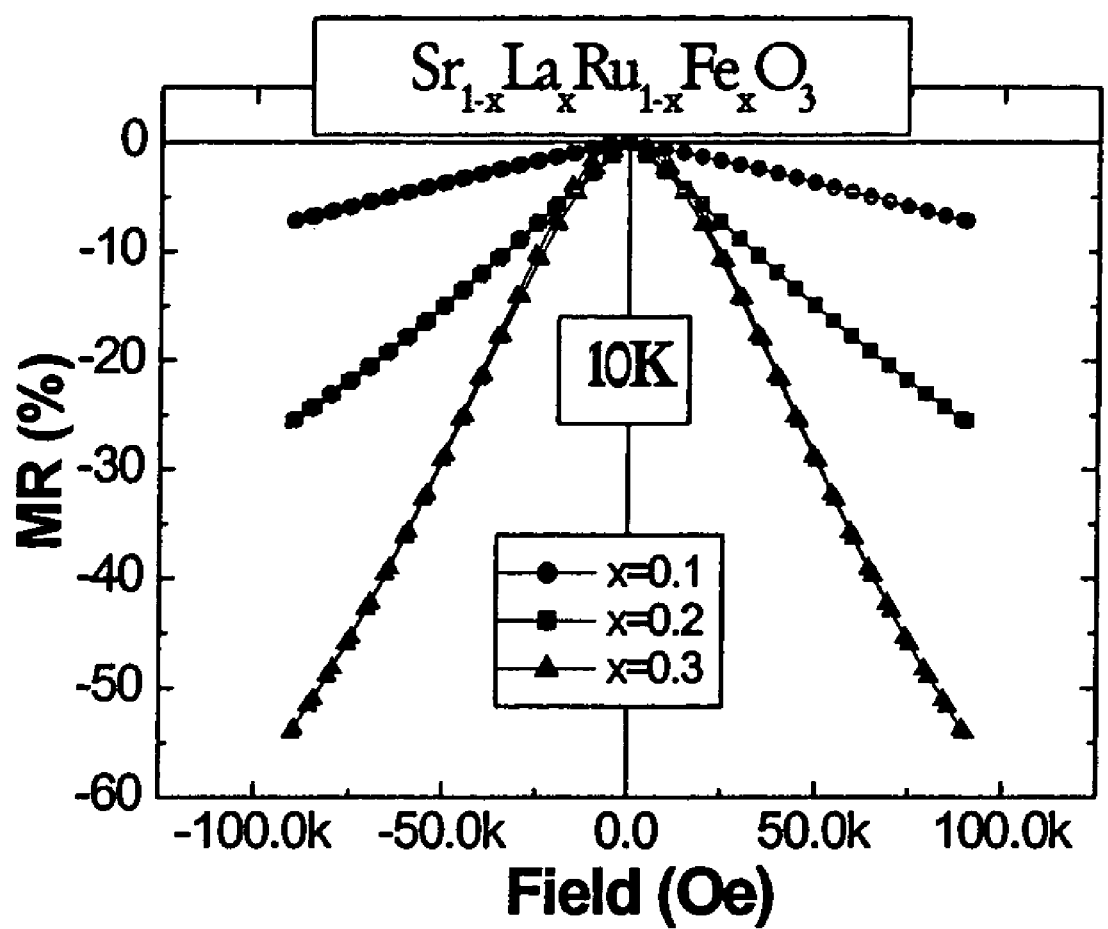
FIG. 1 is a graphical illustration of an exemplary material, $Sr_{1-x}La_xRu_{1-x}Fe_xO_3$, in accordance with a preferred embodiment, at 10 K as a function of applied magnetic field for different substitution values.

In accordance with a preferred embodiment, the present invention includes a family of ruthenates, characterized by the perovskite oxide formula $A(Ru_{1-x}M_x)O_3$, that when synthesized exhibit (i) a large MR effect over a broad range of temperatures, and (ii) an electrical EPIR effect at room temperature. In the formula $A(Ru_{1-x}M_x)O_3$, x is preferably greater than 0 and smaller than 1; M is preferably chosen from the group consisting of the following magnetic elements: Ti, V, Cr, Mn, Fe, Co, and Ni (or any mixture thereof), and A is preferably chosen from the following: K, Ca, Sr, Ba, Pb, Bi, La, Ce, Pr, Nd, Pm, Sm, Eu, Gd, Tb and Y (or any mixture thereof). Preferably, 0.1<x0.9; more preferably 0.01<x<0.5. Optionally, other elements, including Sc, Y, Zr, Nb, Hf, Ta, Al, Ga, Ge, and Sn, may also be incorporated as M in minority to vary the magnitude of electrical resistance.

By 'mixture' is meant the combination of two or more compounds selected from the foregoing lists using recognized methods. For example, either Ca or Sr may be used individually in the formulation at position A, or a mixture of any number of the compositions listed for the A position may be mixed, such as a combination of Ca and Sr together as a mixture, which mixture may then instead be used in the formula at position A. Similarly, any number of the compositions listed for position M may also be mixed to fill the M position in the formulation. Thus, two or more of the various components of the starting materials can be combined to pre-react, for example, before finally combining together in the final formulation. 'Mixture' in this situation, however, does not usually refer to the mixing of the selected compositions listed for position A with those listed for position M in the formulation. Some elements, such as Y and Tb, may naturally enter both position A and position M. However, these are exceptions and not rule.

The source or starting materials for the formulation can be selected from purified forms of the metals, salts or other forms, because once it has been added to the formula for the final perovskite product, each component exists as an ion. For example, Ru metal may be used to replace $RuO_2$ as a starting material.

In addition to the oxides mentioned above, which are all perovskites or related to perovskites having structures consisting of a network of $BO_6$ octahedra, where B is a metal cation, where B includes both Ru and M, in accordance with an alternative embodiment, the present invention includes an additional class of octahedral network materials that contains mostly $BO_6$, although such network is grouped into layers. One such family of layered perovskite materials is represented by $A_2(Ru_{1-x}M_x)O_4$, in which x is preferably greater than 0 and smaller than 1, where M is preferably chosen from the group consisting of the following magnetic elements, Ti, V, Cr, Mn, Fe, Co, and Ni (or its mixture), and A is preferably chosen from the group consisting of: K, Ca, Sr, Ba, Pb, Bi, La, Ce, Pr, Nd, Pm, Sm, Eu, Gd, Tb and Y (or its mixture). Optionally, other elements, including Sc, Y, Zr, Nb, Hf, Ta, Al, Ga, Ge, and Sn, may also be incorporated as M in minority to vary the magnitude of electrical resistance.

The present invention also includes other layered perovskite ruthenates of the formula $A_{n+1}(Ru_{1-x}M_x)_nO_{3n+1}$, where n is any positive integer, and A and M are similarly comprised as described above. Thus, $A_2(Ru_{1-x}M_x)O_4$, mentioned above, belongs to this family in the special case of n equal to one. Large MR effects that are enhanced at low temperatures and large EPIR effects at room temperature can be expected in these materials.

The thus-prepared Ru-rich perovskites and layered perovskites, containing magnetic elements, have large electrical resistance change under magnetic stimulation at low temperatures (the MR effect). They can also be prepared in air without difficulty, unlike some of the other magnetoresistant oxides for which a deliberate preparation under a reducing atmosphere or vacuum is needed. At room temperature, they can have large electrical resistance change under the stimulation of a large electrical field (the EPIR effect), which may be caused by a small voltage when the materials are in the form of a thin film.

Although Ru has been used as an additive to manganates to alter their properties in the prior art, Ru has not been the primary component of the composition. Although mixed valency may occur in Ru in certain compositions of the foregoing (for example when Co is present), the presence of the large MR and EPIR in the preferred embodiments of the invention is not sensitive to whether Ru has mixed valency or not.

In accordance with the present invention, any known chemical method of mixing elements and forming powders or ceramics may be used to form the bulk materials, such as the sol gel methods, or standard ceramic processing methods, e.g., metallo-organic decomposition methods, or chemical vapor deposition methods. A preferred synthetic method to prepare the ruthenate materials of the present invention is the sol gel method as described in Examples that follow.

However, the ruthenate materials can also be synthesized by standard ceramic processing methods as used to form bulk materials. For example, to obtain $(Sr_{0.7}La_{0.3})(Ru_{0.7}Fe_{0.3})O_3$, starting materials such as $SrCO_3$, $La_2O_3$, $RuO_2$, and $Fe_2O_3$ powders were first mixed using standard mixing techniques, such as hand mortar mixing, ball milling, or attrition milling, then fired at various temperatures for various times from 750° C. to 1200° C. to obtain a uniform powder of the $(Sr_{0.7}La_{0.3})(Ru_{0.7}Fe_{0.3})O_3$ composition. The powder was preferably verified, for example, using powder x-ray diffraction (XRD). Based upon the diffraction pattern, the resulting material was classified as an orthorhombic type of perovskite. The powder was then compacted and sintered to high density to produce the resulting material, commonly referred to as ceramic, for magnetic and electrical applications. However, the presence of other minority phases in the composition has no significant effect on the resulting large MR and EPIR effects. In fact, the existence of selected minority phases in the composition may be advantageous under certain conditions.

Common phases that may coexist with the above perovskite include, for example, $SrRuO_3$ which has a ferromagnetic transition, various layered perovskites that have a higher ratio of (Ru, M) to A than one, as in the form of $A(Ru_{1-x}M_x)O_3$, (the ratio of B to A is one, if B is viewed as $(Ru_{1-x}M_x)$), and other forms of $ABO_3$ compounds whose structures are not perovskite-based, and $RuO_2$. The small modification of structure, in the lattice parameter or in the unit cell distortion, which may be introduced by using different elements among M and different elements among A, may also be practiced. This can be advantageous, for example, in preparing thin films when the lattice matching of the film and the substrate crystals is important for maintaining the film quality. Likewise, when ruthenates of various layered perovskite structures are prepared, for example $(Sr_{1.8}La_{0.2})(Ru_{0.8}Fe_{0.2})O_4$, of the $A_2(Ru_{1-x}M_x)O_4$ family, common phases that may coexist without deleterious effect on MR and EPIR effects, include, for example, $SrRuO_3$, as well as other forms of $ABO_3$ compounds whose structures are either perovskite or not perovskite-based, or various other layered perovskites that have a ratio other than 2 of A to (Ru, M) as in $A_2(Ru_{1-x}M_x)O_4$, or $RuO_2$.

Figure 2:
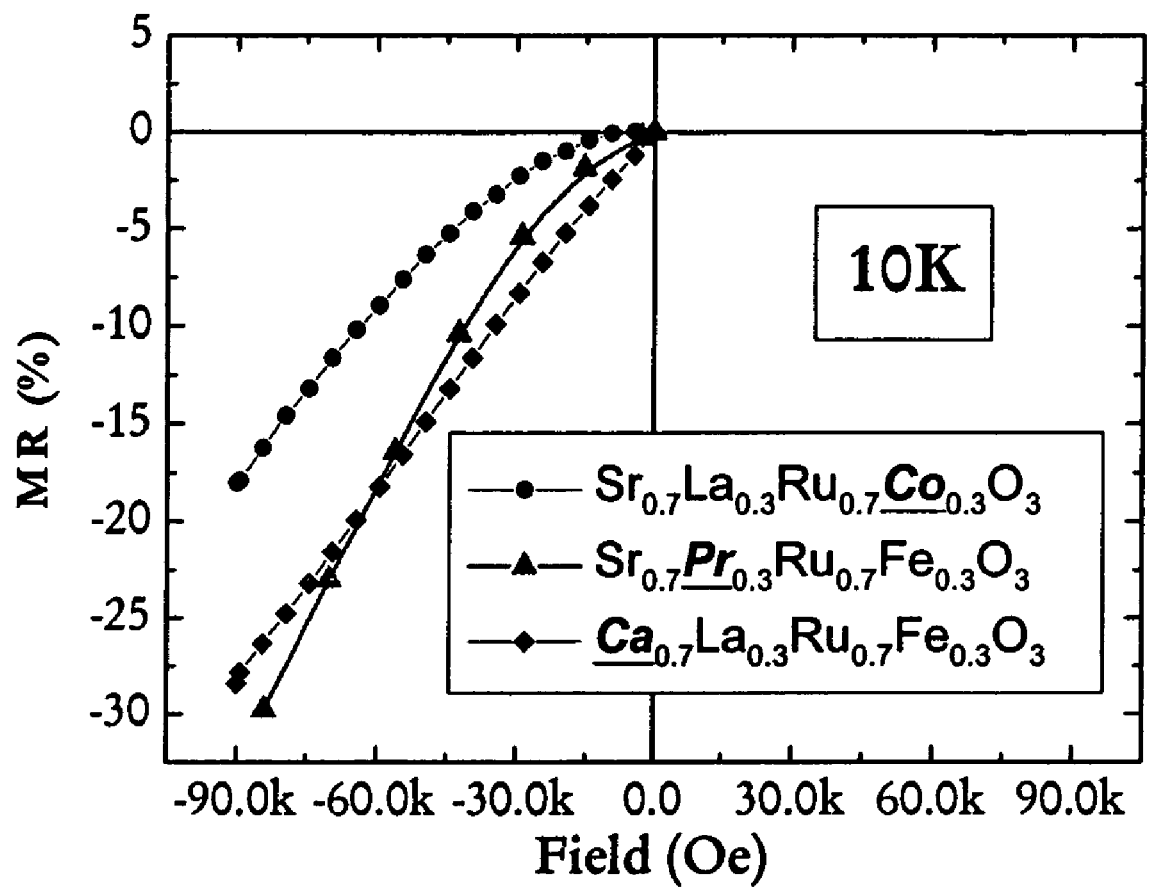
FIG. 2 is a graphical illustration of the magnetoresistance at 10 K as a function of applied magnetic field for other exemplary materials.

The magnetoresistance of the material is preferably verified by measurement of electrical resistance as a function of magnetic field. Typically, this is performed by using the "four-point-probe" method, and electrical resistance decreases with the magnetic field. A dependence of the electrical resistance with the magnetic field is shown for three compositions, $(Sr_{0.7}La_{0.3})(Ru_{0.7}Fe_{0.3})O_3$, $(Sr_{0.8}La_{0.2})(Ru_{0.8}Fe_{0.2})O_3$, and $(Sr_{0.9}La_{0.1})(Ru_{0.9}Fe_{0.1})O_3$, in FIG. 1. The percentage of resistance change increases with decreasing temperature for all three compositions. Examples of other compositions include replacing Fe in group M by one or more of other elements from the group of Ti, V, Cr, Mn, Co and Ni, and replacing A by one or more of other elements from the group of K, Ca, Sr, Ba, Pb, Bi, La, Ce, Pr, Nd, Pm, Sm, Eu, Gd, Tb and Y. FIG. 2 illustrates the effect of replacing Fe by Co, replacing Sr by Ca, and replacing La by Pr, respectively. Nevertheless, as shown in FIG. 2, large MR is observed in all cases. Most likely at least some Cr, Mn, Fe, Co, or Ni is needed for a MR effect, although for EPIR, the restriction are less stringent.

The materials prepared in accordance with a preferred embodiment of the invention may also be used in thin film form. For example, it may be used to prepare a magnetic sensor or a nonvolatile resistive memory element. Ceramic ruthenates may also be used as a target to form thin films on a selected substrate using standard deposition techniques, such as, but without limitation, multi-target pulse laser deposition PLD (with targets of individual oxides), DC and radiofrequency (RF) sputtering, magnetron sputtering, ion beam sputter deposition, and reactive physical vapor deposition (these methods require a ceramic target). Other standard thin film deposition techniques that may or may not require a ceramic target, such as, but without limitation, metal-organic CVD, reactive physical vapor deposition, slurry coating, electrophoretic deposition and sintering, high velocity flame spraying, as well as sol-gel spin coating process, or any mixture of the described methods, may also be employed, as are standard deposition methods that use metal (rather than ceramic) targets. In one preferred embodiment, thin films are prepared using the sputtering technique. In another, sol-gel processes are preferred. In yet another (the PLD technique), targets made of material of the required composition, prepared by the sol-gel process or standard ceramic process, are ablated by an excimer UV laser to produce a thin film material of the same composition on the supplied substrate. Depending on the substrate type and temperature during deposition, polycrystalline or single crystal thin films can be prepared.

The present invention also provides a method for preparing a thin film magnetic sensor formed on a substrate. The thin film magnetic sensor is made of a magnetoresistive material prepared in the manner described above, with electrical contacts arranged in the four-point configuration. By choosing the appropriate composition, the electrical resistance that decreases nearly linearly with the applied field, up to at least 9 T, can be obtained. Epitaxial and single crystal thin films are often obtained when single crystals are used as substrates. However, commonly, such films have the same MR effect as in the bulk ceramics, whether the films are epitaxial or not (see FIG. 7 in Example 1 that follows for a composition of $Sr_{0.7}La_{0.3}Ru_{0.7}Fe_{0.3}O_3$ on a single crystal oxide substrate). Such a sensor can be advantageously used at low temperature under a high field, for example, in the superconducting coil of a MRI device commonly utilized for medical imaging.

Figure 3:
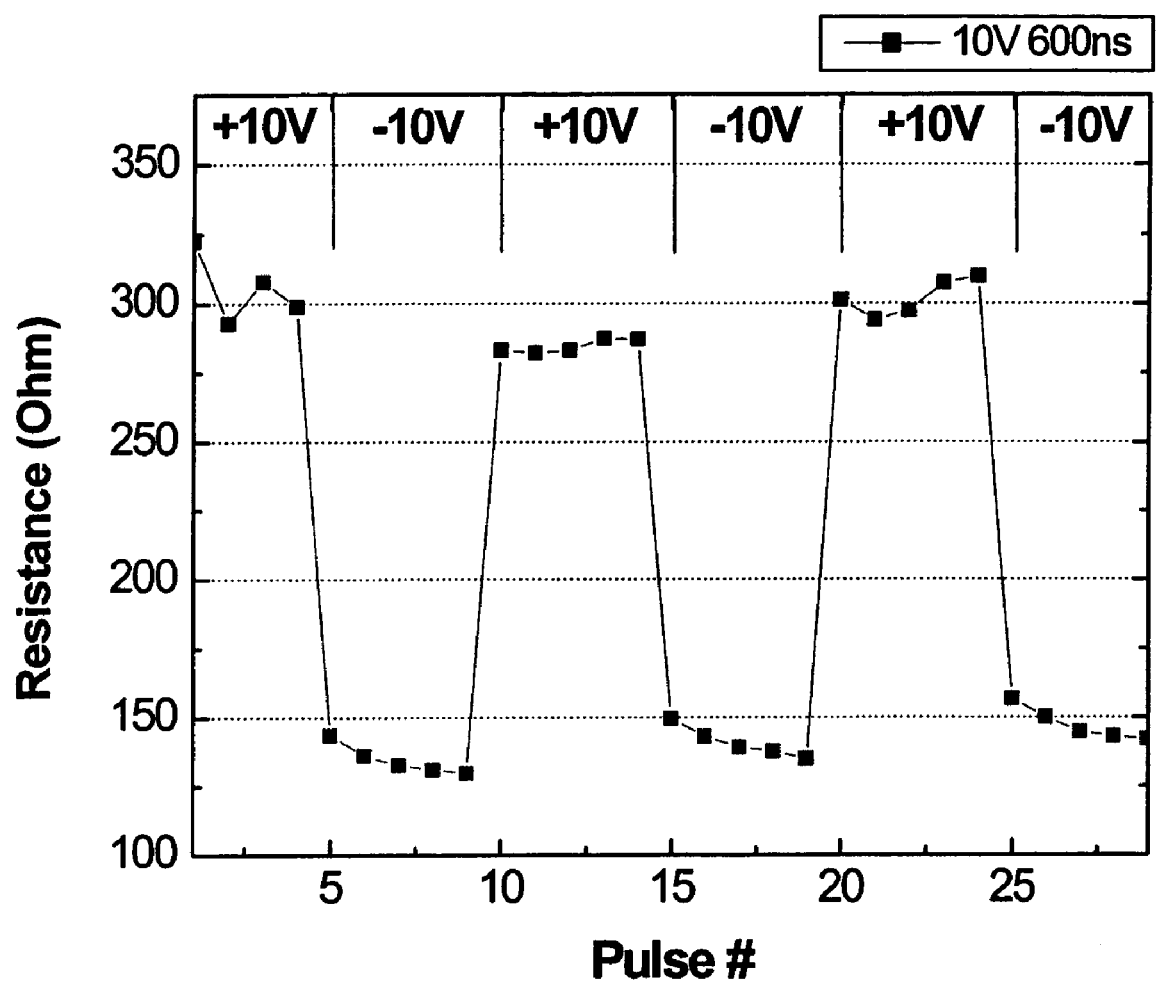
FIG. 3 is a graphical illustration of the switching behavior of a thin film of an exemplary material, $Sr_{0.7}La_{0.3}Ru_{0.7}Fe_{0.3}O_3$, prepared on a silicon substrate with Pt coated Si as the bottom electrode upon application of voltage pulses of amplitude 10 V and 600 ns duration.
Figure 4:
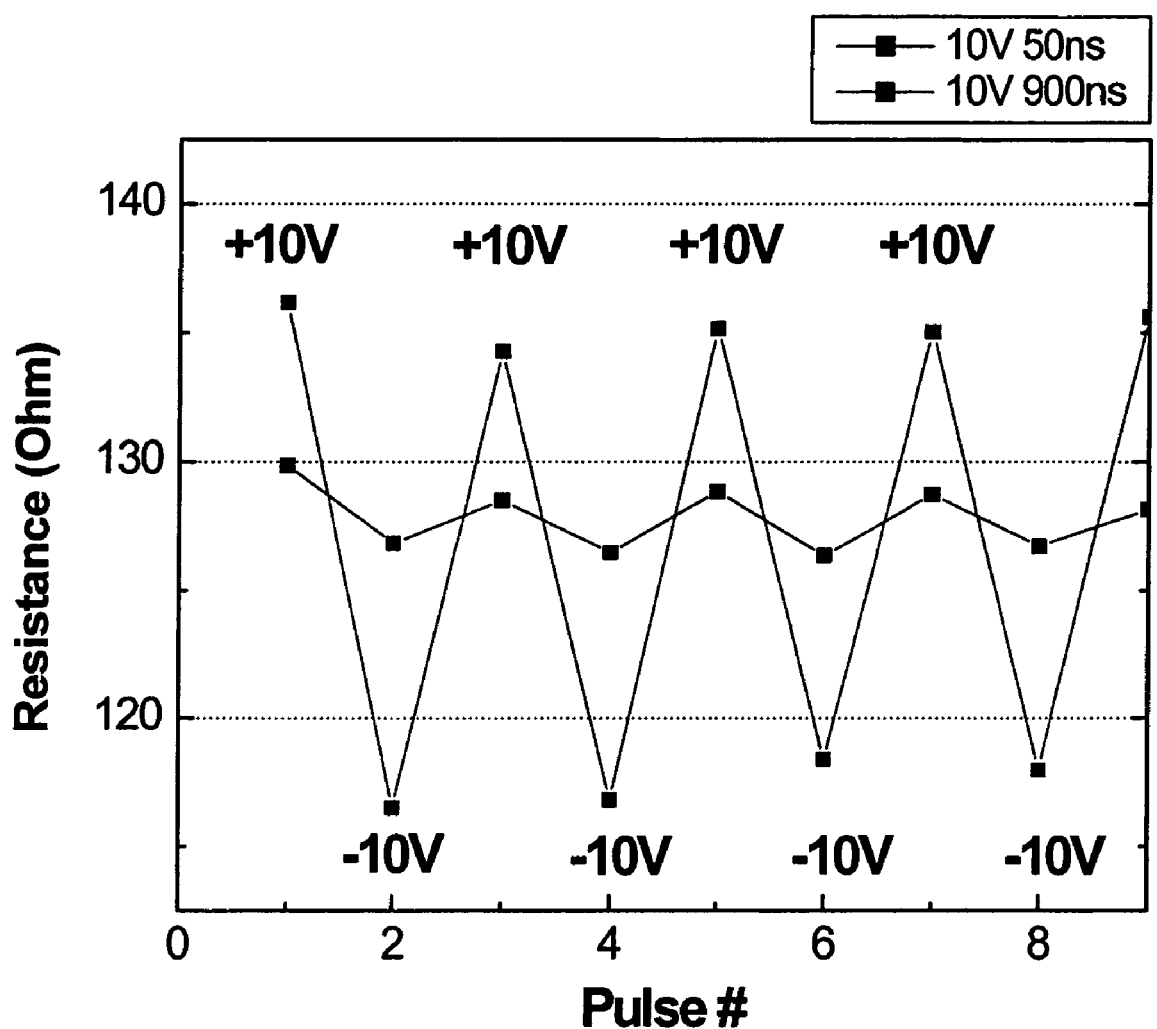
FIG. 4 is a graphical illustration showing the ability to repeatedly change resistance of an exemplary material, $Sr_{0.7}La_{0.3}Ru_{0.7}Fe_{0.3}O_3$, prepared on a silicon substrate with Pt-coated silicon as the bottom electrode by the application of a single 10V electrical pulse of alternating polarity and duration.

The materials in accordance with these embodiments exhibit EPIR effect in the electrical properties, as shown in FIG. 3. This illustrates the switching behavior of the thin film of the composition $Sr_{0.7}La_{0.3}Ru_{0.7}Fe_{0.3}O_3$, prepared on a silicon substrate with Pt as the bottom electrode. With the application voltage pulses of amplitude 10 V and 600 nanoseconds (ns) in duration, the resistance of the film is increased or decreased depending on the pulse polarity. FIG. 4 illustrates the ability of the material to repeatedly change resistance by the application of a single electrical pulse of alternating polarity. The magnitude of the change can be controlled by the pulse width and voltage. Such a thin film provides a means to store information in microelectronic devices in a simple two terminal configuration. The memory is non-volatile, multivalued, and overwritable.

Composition and film thickness can also be adjusted to obtain different switching behavior. For example, with decreasing Fe and La content (i.e., decreasing x) in the $Sr_xLa_{1-x}Ru_{1-x}Fe_xO_3$ series, the resistance decreases. Conversely, by increasing Ti content (i.e., increasing x) in $SrRu_{1-x}Ti_xO_3$, or by increasing Zr in $SrRu_{1-x}Zr_xO_3$, the resistance increases. These adjustments will allow the memory cell resistance, which depends on the cell size and film thickness, e.g., to fall in a range that is suitable for microelectronic device applications.

Compared to the manganate materials taught by the prior art, ruthenates generally have a lower deposition temperature allowing highly crystalline thin films to form. The lower crystallization temperature makes the disclosed materials better candidates for integration with existing silicon-based electronics technology.

EXAMPLES

Example 1

Large Negative MR and EPIR in B-site-Fe-doped Ruthenates $Sr_{1-x}La_xRu_{1-x}Fe_xO_3$ series—Magnetically glassy Fe-doped ruthenates of perovskite and layered perovskite can be derived from a parent compound that is either magnetic or nonmagnetic. In this example, the materials were obtained by alloying $FeO_6$ octahedra into parent ruthenate compounds that are metallic. These parent compounds are either ferromagnetic ($SrRuO_3$) or paramagnetic ($CaRuO_3$ and $Sr_2RuO_4$) and their structures are either perovskite type ($SrRuO_3$ and $CaRuO_3$) or layered perovskite type ($Sr_2RuO_4$). Since octahedral $Fe^{3+}$ ions in perovskite-type structures are known to couple antiferromagnetically, magnetic frustration easily arises in a randomly Fe-alloyed $BO_6$ network, resulting in a spin glass. The resulting large negative MR that is observed appears to be associated with the Fe impurities which operate as atomic-scale "spin valves," allowing electrical current to pass through when the spatially adjacent electronic states are spin aligned.

Figure 5:
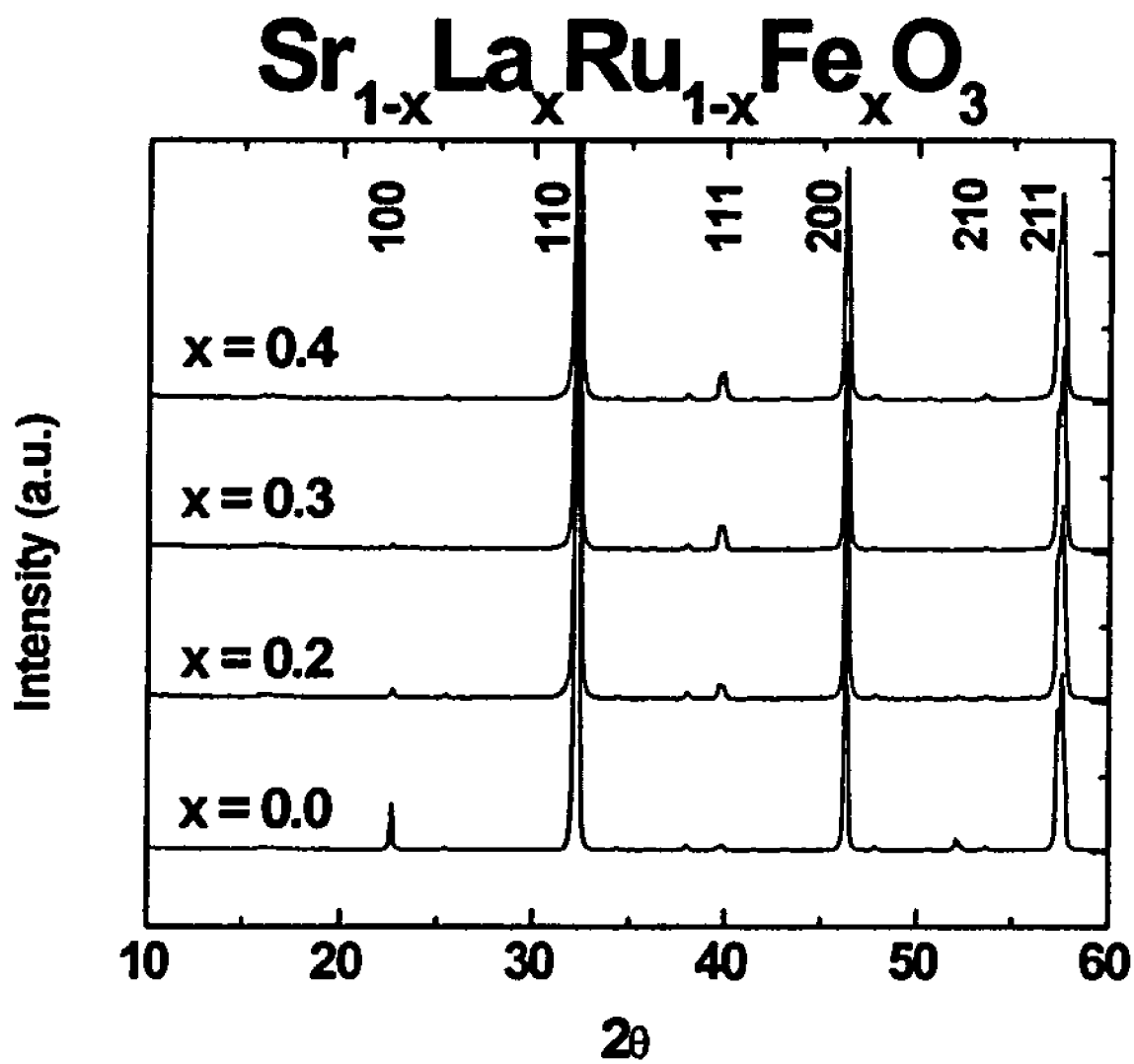
FIG. 5 depicts room temperature powder x ray diffraction (XRD) patterns of an exemplary material, $Sr_{1-x}La_xRu_{1-x}Fe_xO_3$, taken with $CuK_\alpha$ radiation and indexed using a pseudocubic cell of perovskite. There is no evidence of impurity phases near the 110 reflection.

Using a modified sol-gel method the materials were synthesized to first obtain mixed ruthenate powders of high re-activity. Typical powders after calcination had a Brunauer-Emmett-Teller (B.E.T.) surface area of 16 $m^2/g$, indicating a particle size of about 30 nm. Sintering was conducted in air at a temperature ranging from 1200 to 1450° C. using $SrRuO_3$ powder packs to suppress Ru volatilization. The XRD patterns of three sintered compounds are shown in FIG. 5. Thermogravimetry measurements found no weight change up to 800° C., indicating the stability of $Ru^{4+}$ and $Fe^{3+}$ valence states, since any mixed valence would have caused oxygen exchange starting at 400–600° C. when oxygen diffusion becomes viable. Near (x-ray) absorption edge fine structures also verified the above valence states (data not shown).

Figure 6:
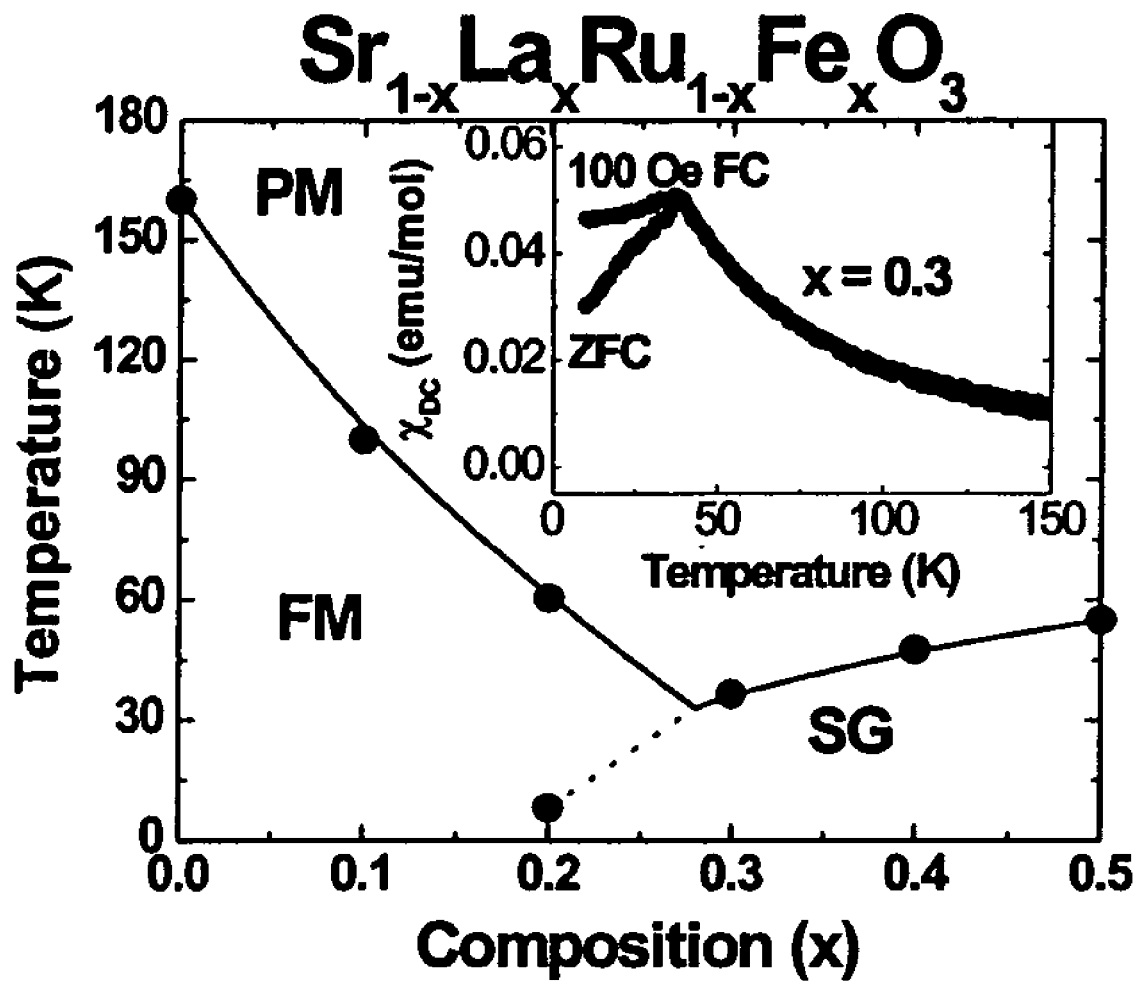
FIG. 6 is a magnetic phase diagram of an exemplary material, $Sr_{1-x}La_xRu_{1-x}Fe_xO_3$, determined using ac/dc magnetization data. Ferromagnetic (FM); Paramagnetic (PM); Spin glass (SG). The inset shows the temperature dependence of the ac susceptibility under field-cooled (100 Oe) and zero-field cooled conditions.

Magnetic characterization was performed using a magnetometer (Quantum Design PPMS) under ac and dc magnetization conditions. Upon Fe doping, magnetic frustration eventually manifests itself in the spin glass state, which is outlined in the phase diagram in FIG. 6 for the $Sr_{1-x}La_xRu_{1-x}Fe_xO_3$ series. In this diagram, the $T_c$ of the paramagnetic-to-ferromagnet transition decreases with x until the ferromagnetic phase disappears at x<0.3. Representative spin glass behavior (shown in the inset of FIG. 6) of hysteretic magnetization below the freezing temperature is shown for x=0.3 for field-cooled and zero-field-cooled conditions. Hysteresis below the freezing temperature signifies a spin glass.

Figure 7:
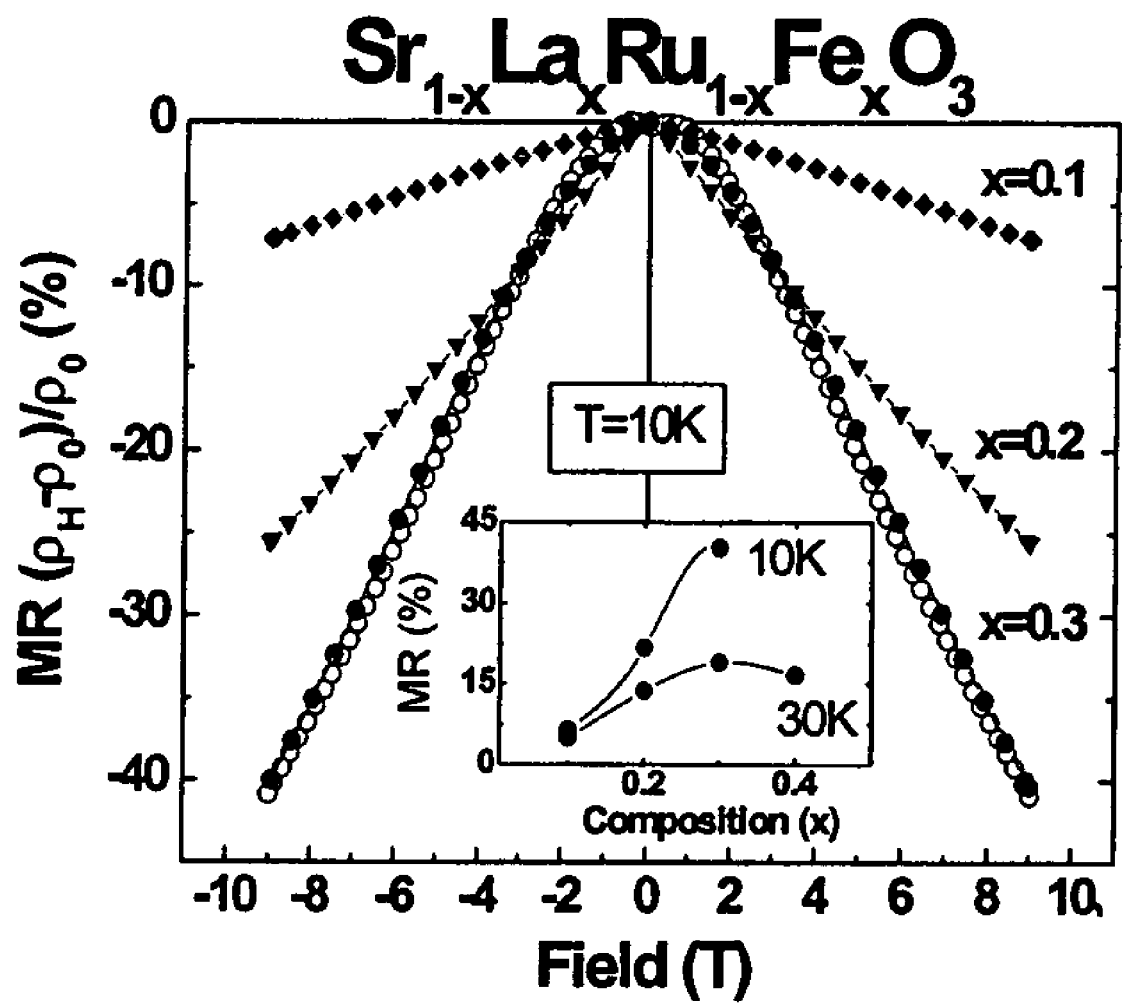
FIG. 7 shows field dependence of the MR of an exemplary material, $Sr_{1-x}La_xRu_{1-x}Fe_xO_3$, for x=0.1–0.3 at 10 K. The MR is normalized by the resistance at zero field. The inset shows the MR has a maximum at x=0.3 at both 10 and 30 K, and that the MR at 10 K is larger. At 10 K, the resistivity of x=0.4 was too high to measure in this study. All data are from bulk polycrystals except the ones shown by the curve of connecting open circles that were from a (001) thin film with x=0.3.

Large MR was observed in the composition range of 0.2<x<0.4 in the series $Sr_{1-x}La_xRu_{1-x}Fe_xO_3$. As shown in FIG. 7, the resistivity decreased with the magnetic field. The MR effect is largest at x=0.3 (see also inset in FIG. 3) and is always larger at lower temperatures (see inset), reaching 43% at 10K in a field of 9 tesla (9T). The nearly linear field dependence indicated that MR was not yet saturated at this field. Importantly, no MR effect was observed in ferromagnetic $SrRuO_3$ (x=0), except in the vicinity of $T_c$ (160 K), as previously reported (Gausephol et al., Phys. Rev. B52:3459 (1995); Klein et al., 1999). A comparison of FIG. 6 and the MR in FIG. 7 makes it clear that, in the $Sr_{1-x}La_xRu_{1-x}Fe_xO_3$ series, large MR only exists in the spin glass region.

To determine whether the MR effect is intrinsic or not, the above data were compared with those of thin films that were prepared on (001) $SrTiO_3$ substrates using pulse laser deposition method of Choi et al. (*Appl. Phys. Lett.* 79:1447 (2001)). These films were strongly (001) oriented, are 100 nm thick, and have a roughness of 0.3 nm over a 2 μm×2 μm area. The MR of the x=0.3 sample at 10 K is shown in FIG. 7, and it shows remarkable agreement with the data of the bulk polycrystal. Since these films have very few, if any, random grain boundaries, the MR observed is a confirmed intrinsic property of the grains.

As an example of ruthenate thin films that exhibit EPIR effect at room temperature, a ceramic target of x=0.3 composition was prepared using the sol gel process. The target has a diameter of 1 inch. Using pulse laser deposition at 600° C., thin films of the same composition was deposited on a silicon substrate, which contains a surface platinum coating providing a conducting bottom electrode for the thin film. This thin film was tested using a probe station which provides a top electrode made of a tungsten tip. Electrical pulses of various amplitude and duration were supplied by a pulse generator (Agilent 33250A type) and the electrical resistance of the films was measured, after the isolation of the pulse generator passage, using a multimeter with a programmed relay, subsequent to electrical pulse stimulation. With the application voltage pulses of amplitude 10 V and 600 nanoseconds (ns) in duration, the resistance of the film is increased or decreased depending on the pulse polarity as shown in FIG. 3. FIG. 4 illustrates the ability of the material to repeatedly change resistance by the application of a single electrical pulse of alternating polarity. The magnitude of the change can be controlled by the pulse width and voltage.

Figure 8:
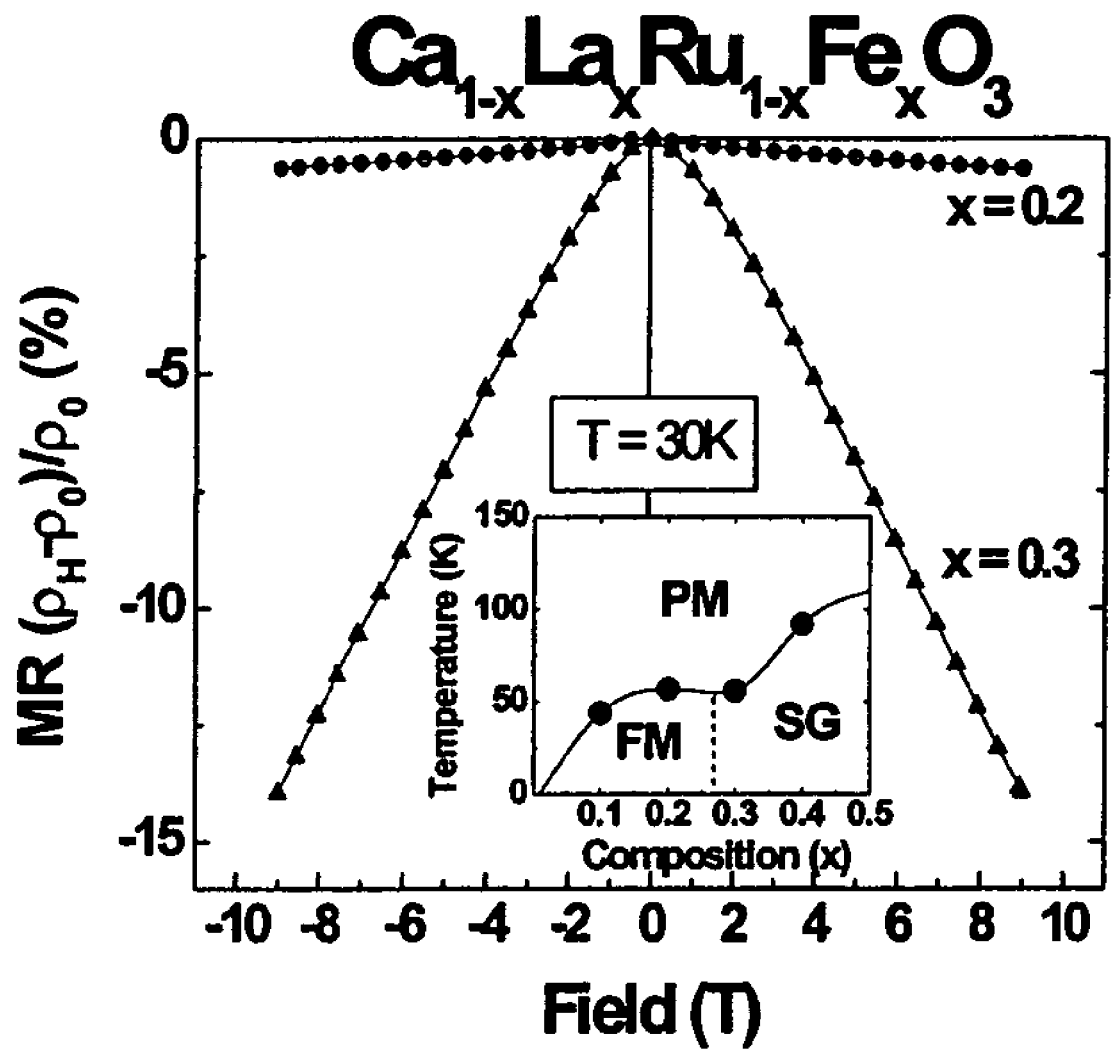
FIG. 8 shows field dependence of the MR of an exemplary material, $Ca_{1-x}La_xRu_{1-x}Fe_xO_3$, for x=0.2–0.3 at 30 K. The MR is normalized by the resistance at zero field. The inset shows the magnetic phase diagram.

$Ca_{1-x}La_xRu_{1-x}Fe_xO_3$ series—When Example 1 was essentially repeated, except using the $Ca_{1-x}La_xRu_{1-x}Fe_xO_3$ series, a large MR at x=0.3 was also observed as shown in FIG. 8. Although $CaRuO_3$ is not ferromagnetic, a small amount of doping was found to induce ferromagnetism, e.g., in $Ca_{0.9}La_{0.1}Ru_{0.9}Fe_{0.1}O_3$. Indeed, a spin glass region exists for 0.2<x<0.4 as shown in the inset of FIG. 8. Alloying-induced ferromagnetism is well documented in this compound, and supports the understanding that $CaRuO_3$ is on the verge of band ferromagnetism (He et al., *Phys. Rev.* B63: 172403 (2001); He et al., *J. Phys.: Condens. Matter* 13:8347 (2001)). As in the case of the $Sr_{1-x}La_xRu_{1-x}Fe_xO_3$ series in Example 1, however, the MR of the ferromagnetic alloy is very small (see, e.g., x=0.2 in FIG. 8). In contrast, the large MR composition of x=0.3 is well inside the spin glass region (shown in the inset). Therefore, unlike manganites, strong ferromagnetism does not coexist with strong MR in these Sr- and Ca-containing perovskite ruthenates.

Figure 9:
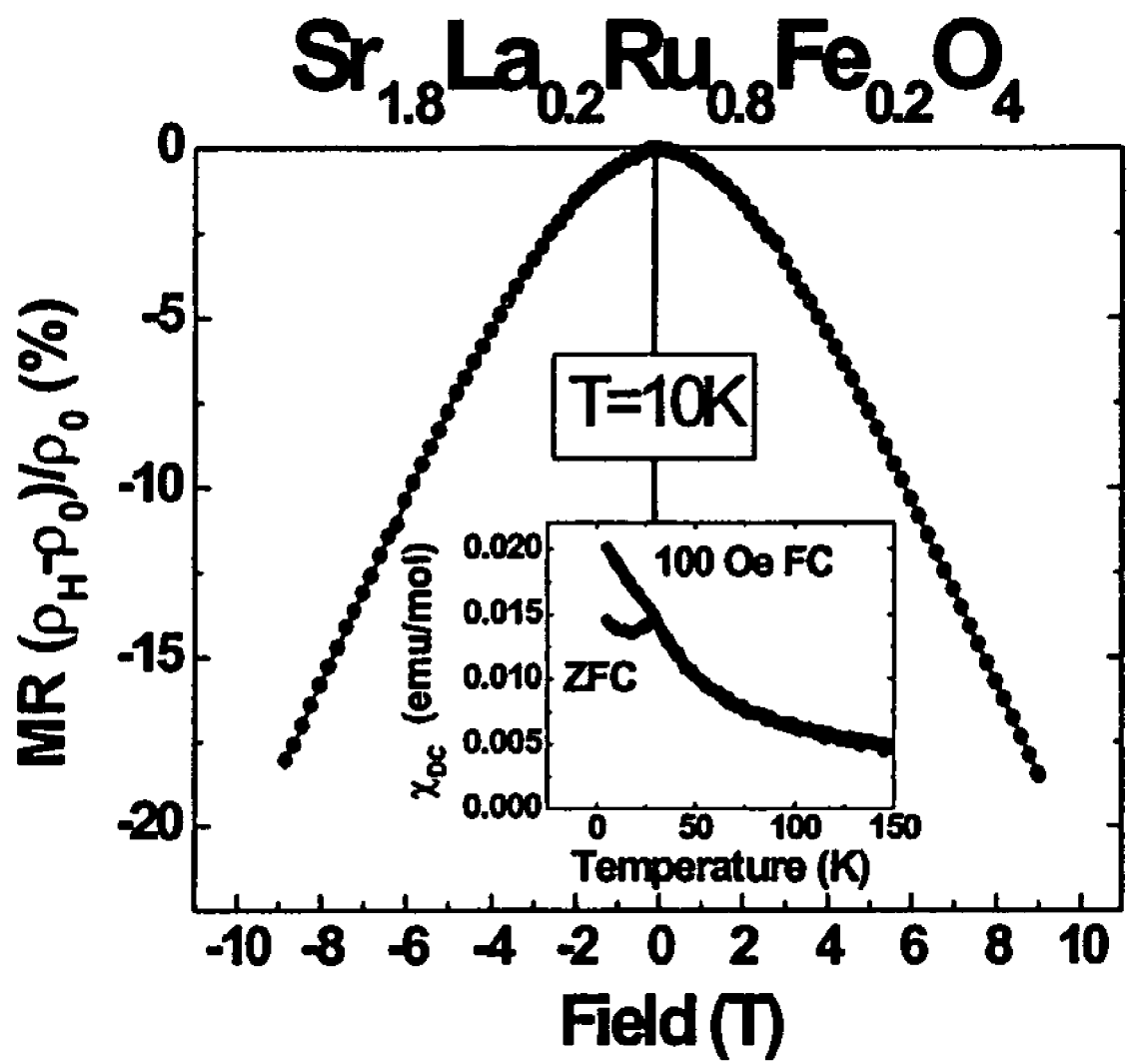
FIG. 9 shows field dependence of the MR of an exemplary material, $Sr_{1.8}La_{0.2}Ru_{0.8}Fe_{0.2}O_4$. The MR is normalized by the resistance at zero field. The inset shows the temperature dependence of the ac susceptibility under field-cooled (100 Oe) and zero-field-cooled conditions, and indicates hysteresis below the freezing temperature.

$Sr_{2-x}La_xRu_{1-x}Fe_xO_3$ series—Large MR was also observed in the layered perovskite $Sr_2RuO_4$ when doped with 20% $LaFeO_3$. As shown in FIG. 9, at 10 K and 9 T, a MR of 18% was found. This value is comparable to the MR value of $Sr_{0.8}La_{0.2}Ru0.8Fe_{0.2}O_4$ in FIG. 7 and much larger than that of $Ca_{0.8}La_{0.2}Ru_{0.8}Fe_{0.2}O_3$ (not a spin glass). The magnetization curve of this compound is shown in the inset of FIG. 9, which again verifies the spin glass behavior.

In all of the spin glass ruthenates studied in this example, the dc magnetization was also found to rise with the field applied up to 9 T, with only very small hysteresis at the low field. Also, the data of dc susceptibility at 0.01 and 1 T were almost identical. Comparing these observations with the nearly linear MR shown in FIGS. 7 to 9, it was concluded that the MR is proportional to the field-induced magnetization. Moreover, even without permanent magnetization, the dc magnetization obtained at 9 T was quite large. For example, at 10 K, the dc magnetization of $Sr_{0.7}La_{0.3}Ru_{0.7}Fe_{0.3}O_3$ reaches 3000 emu/mol, which is about 40% the saturation magnetization of $SrRuO_3$. Therefore, it was assumed that magnetic scattering of carriers due to spin misalignment can be substantially suppressed even in a spin glass once a large field is applied, which is consistent with the large MR observed.

This MR effect is consistent with some mechanism of atomic-level spin valves. From the literature on first-principles calculations of energy levels of various ruthenium- and iron-containing perovskites (Kobayashi et al., 1998; Mazin et al., *Phys. Rev.* B56:2556 (1997); Mazin et al., *Phys. Rev.* B61:5223 (2000); Hamada et al., in *Spectroscopy of Mott Insulators and Correlated Metals*, (eds. Fujimori et al.), Springer, Berlin (1995) p. 95), the energy levels of Ru and Fe available for hopping electrons can be estimated and found close to each other, which allow electron hopping in the $BO_6$ network. The effect of a magnetic field is to facilitate spin alignment, hence the MR effect. One would expect that the spin-flip scattering increases with the concentration of the Ru—Fe—Ru spin valves, and that at lower temperatures alignment is easier, so the MR is larger. In addition, in a spin glass, the field effect on resistivity is gradual and linear, lacking the cusp-like feature characteristics of the extrinsic MR.

Example 2

Solution-polymerization Method for the Synthesis of Ruthenate Compounds

Figure 10:
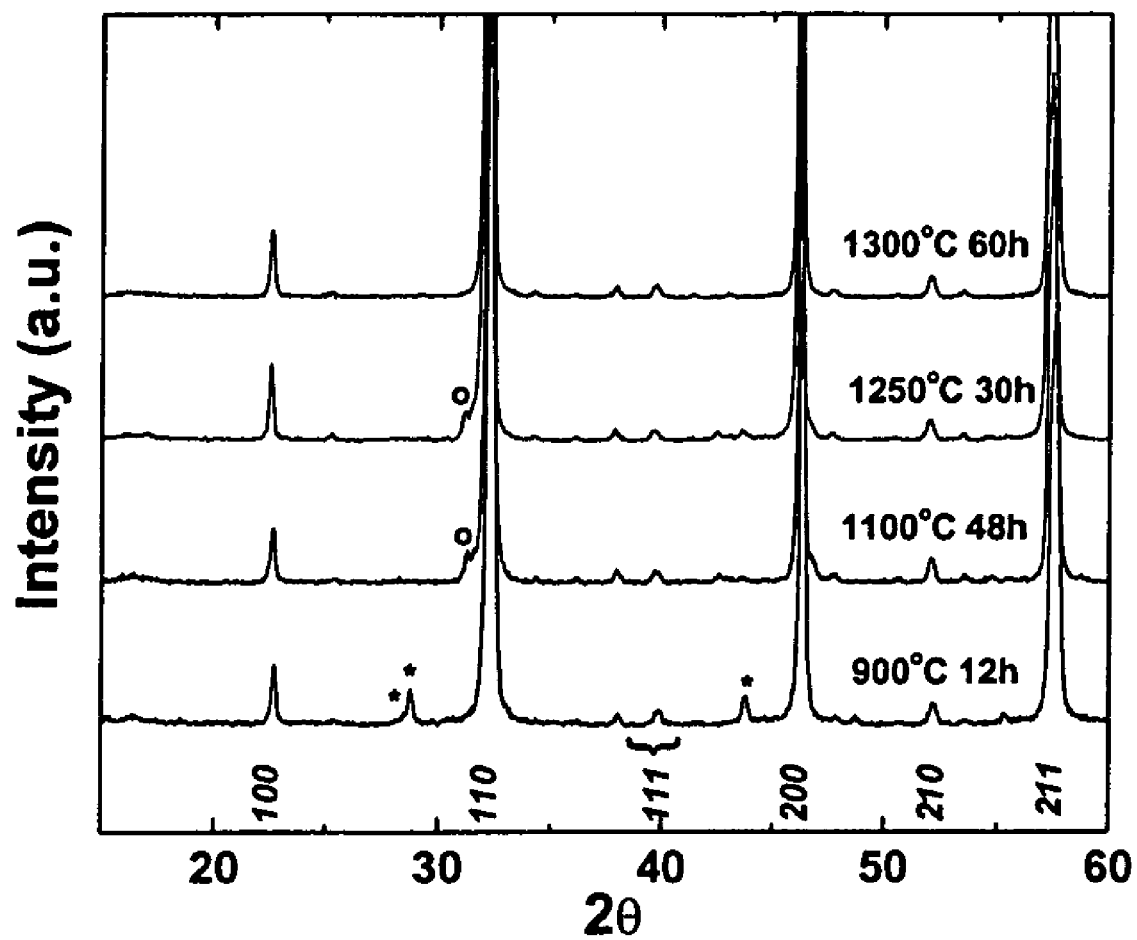
FIG. 10 graphically displays a XRD measurement of an exemplary material, $SrRuO_3$, as a function of calcination temperature and time in the ceramic route. * marks $RuO_2$ and SrO; o marks traces of second phases. Perovskite reflections are indexed in pseudocubic notations.

Polycrystalline samples of $SrRuO_3$ and mixed ruthenates were prepared by conventional ceramic process and two sol-gel processes. These methods are described below using $SrRuO_3$ as an example. Phase homogeneity was verified by means of powder x-ray diffraction (XRD) and magnetic measurements Ceramic Process—In the ceramic process, a stoichiometric mixture of $SrCO_3$ (99.99%, Alfa Aesar, Ward Hill, Mass.) and $RuO_2$ (99.95%, Alfa Aesar) was prepared and calcined in a platinum crucible at 900° C. for 12 hours. After that, powders were reground, pelletized, packed in sacrificial powder of $SrRuO_3$, and heated at 900–1300° C. for 12–96 hours, with intermediate regrinding and examining by XRD measurements every 12 hours to follow the progress of reaction. The XRD measurements were conducted using $CuK_\alpha$ radiation, and the XRD patterns of the $SrRuO_3$ samples prepared by the ceramic route are shown in FIG. 10.

After initial calcination at 900° C. a majority perovskite phase had already formed, but a small amount of unreacted $RuO_2$ and SrO still remained. Subsequent annealing at higher temperatures progressively dissolved these unreacted phases. However, intermediate phases, such as $Sr_2RuO_4$, also formed, but they disappeared after 60 hours. The reaction sequence that was used and the resulting slow kinetics are consistent with the reported findings of other ruthenate researchers (Battle et al., 1989; Kim et al., 1995; He et al., 2001). (Notably, as reported by He et al., 2001, KCl flux was even resorted to as a reaction aid.)

The tendency to form unintended intermediate ruthenate phases is due to the inhomogeneous distribution of Ru and Sr, as well as the volatility of Ru at higher temperatures. As a result, other perovskite-related phases with different A:B cation ratios become at least locally favored.

Solution-Polymerization (sol-gel) Processes—The solution-polymerization method that was used is conceptually similar to the Pechini process (U.S. Pat. No. 3,330,697, herein incorporated by reference). Two variations of the method were used.

Process (A)—In Process (A), a solution of $Sr(NO_3)_2$ was prepared by dissolving a stoichiometric amount of $SrCO_3$ (99.99%, Alfa Aesar) in 1N nitric acid, followed by the addition of an excess amount (3 time in weight) of poly-(ethylene glycol) (PEG, $M_n$~2000 g/mol). A second solution of Ru (III) acetylacetonate ($Ru(acac)_3$) (99%, Strem Chemicals, Inc., Newburyport, Mass.) and PEG in absolute ethanol was also prepared. The two solutions were then mixed together and heated on a hot plate at T<100° C. for several hours with constant stirring to evaporate the solvents, leaving cations that are chelated and incorporated in a molten polymer ($T_m$~55° C.). The latter polymer was then slowly decomposed at higher temperature on the hot plate to obtain precursor powders. The final calcination was performed in a furnace at 850° C. for 12 hours. The calcined powders were ground, pelletized and sintered at temperatures between 1200° C. and 1400° C. for 12 hours.

A disadvantage of Process (A) was the use of $Ru(acac)_3$ as the Ru source. $Ru(acac)_3$ is insoluble in water, necessitating the use of an organic solvent, which may be incompatible with other ion precursors. This problem was circumvented in Process (B) that follows, wherein $RuO_2$ powders were used.

Process (B)—In the second sol-gel process, Process (B), a powdered $RuO_2$ was used instead of Ru (III) acetylacetonate solution, and the amount of PEG polymer was decreased. After solvent evaporation, the mixture was combusted as described above, to obtain the precursor powders.

Figure 11:
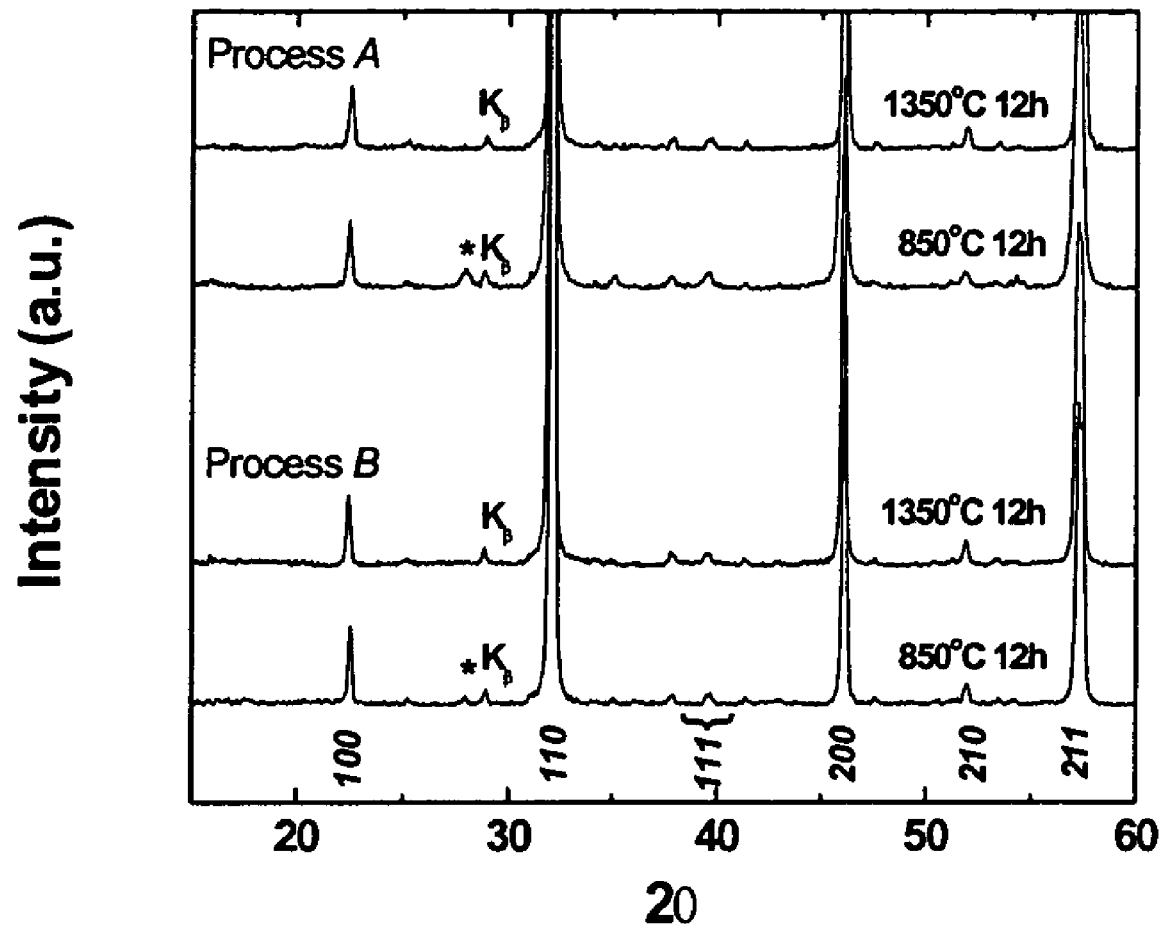
FIG. 11 graphically displays an XRD measurement of an exemplary material, $SrRuO_3$, prepared by the solution-polymerization Process (A) and Process (B). * marks $RuO_2$ and SrO; $K_\beta$ marks 110 reflection from the $CuK_\beta$ line.

In contrast to formulation by the standard ceramic process, the solution-polymerization methods, Process (A) and Process (B), each provided a uniform distribution of source cations that were chelated in the subsequently polymerized precursor, which greatly improved the outcome. FIG. 11 shows the two XRD patterns of $SrRuO_3$ samples prepared by the Process (A). After initial calcination at 850° C., only traces of $RuO_2$ were detected, and they completely disappeared after a second annealing at 1350° C. Note also, that no intermediate phases were detected in either XRD patterns.

Selected XRD patterns of $SrRuO_3$ samples prepared by Process (B) are also shown in FIG. 11. Based upon a comparison of the production patterns of Process (A) and Process (B), it is clear that both yielded similar results for $SrRuO_3$.

Figure 12:
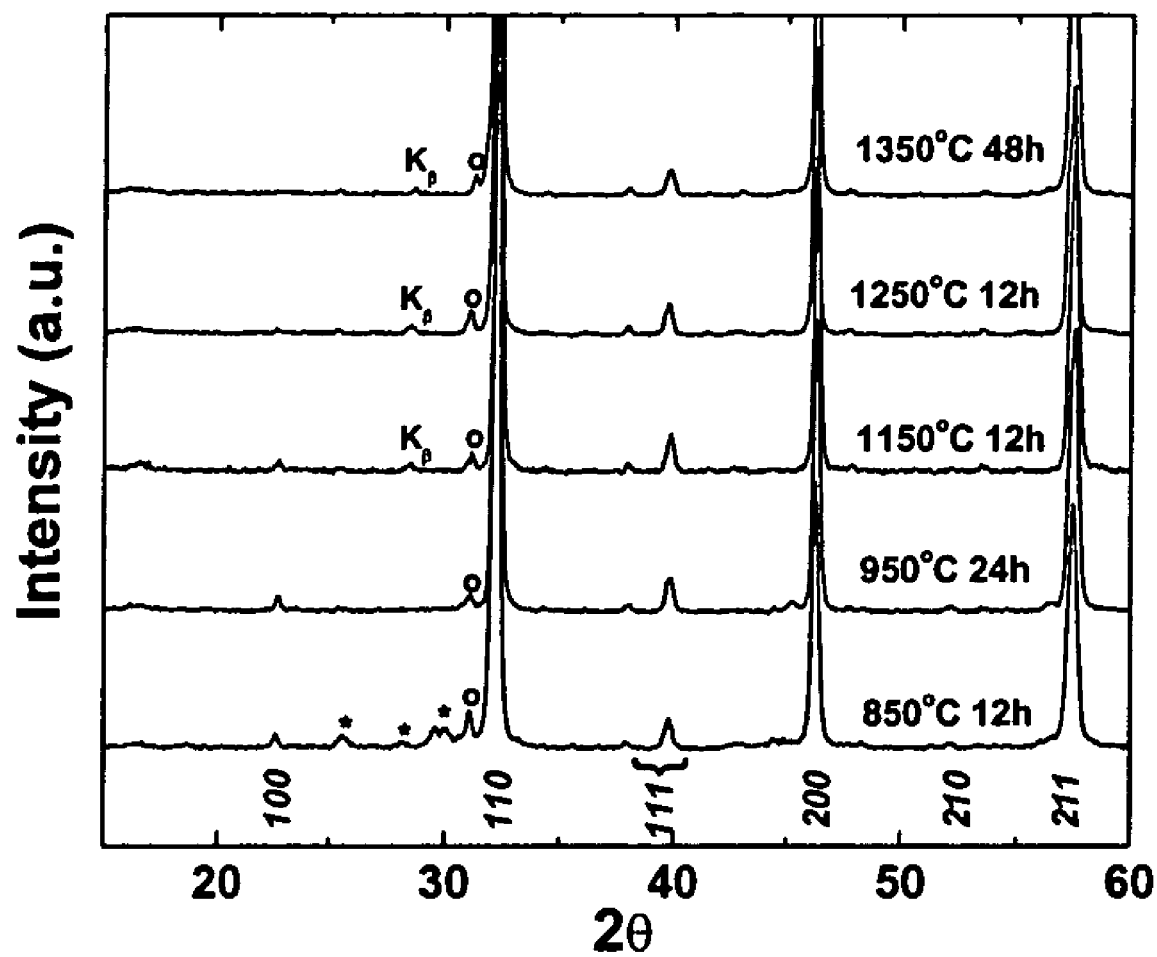
FIG. 12 graphically displays an XRD measurement of an exemplary material, $Sr_{0.7}La_{0.3}Ru_{0.7}Fe_{0.3}O_3$, prepared by the ceramic route. * marks $RuO_2$, $La_2O_3$ and SrO; o marks traces of second phase; $K_\beta$ marks 110 reflection from the $CuK_\beta$ line.

Mixed Ruthenates—As an example of mixed ruthenates, $Sr_{0.7}La_{0.3}Ru_{0.7}Fe_{0.3}O_3$ was prepared by the ceramic route and synthesized by Process (B). In the ceramic process, the additional starting powders used were $La_2O_3$ (99.99%, Alfa Aesar) and $Fe_2O_3$ (99.99%, Alfa Aesar). In the sol-gel processes, the La and Fe sources were their nitrate solutions. Other procedures were used as described above. Their respective XRD patterns are compared in FIGS. 12 and 13. The sintered mixed ruthenate samples were additionally characterized by measuring AC/DC magnetization as a function of temperature. These measurements were performed on a magnetometer (Quantum Design PPMS Model 6000, San Diego, Calif.) in the temperature range of 5–300K.

Figure 13:
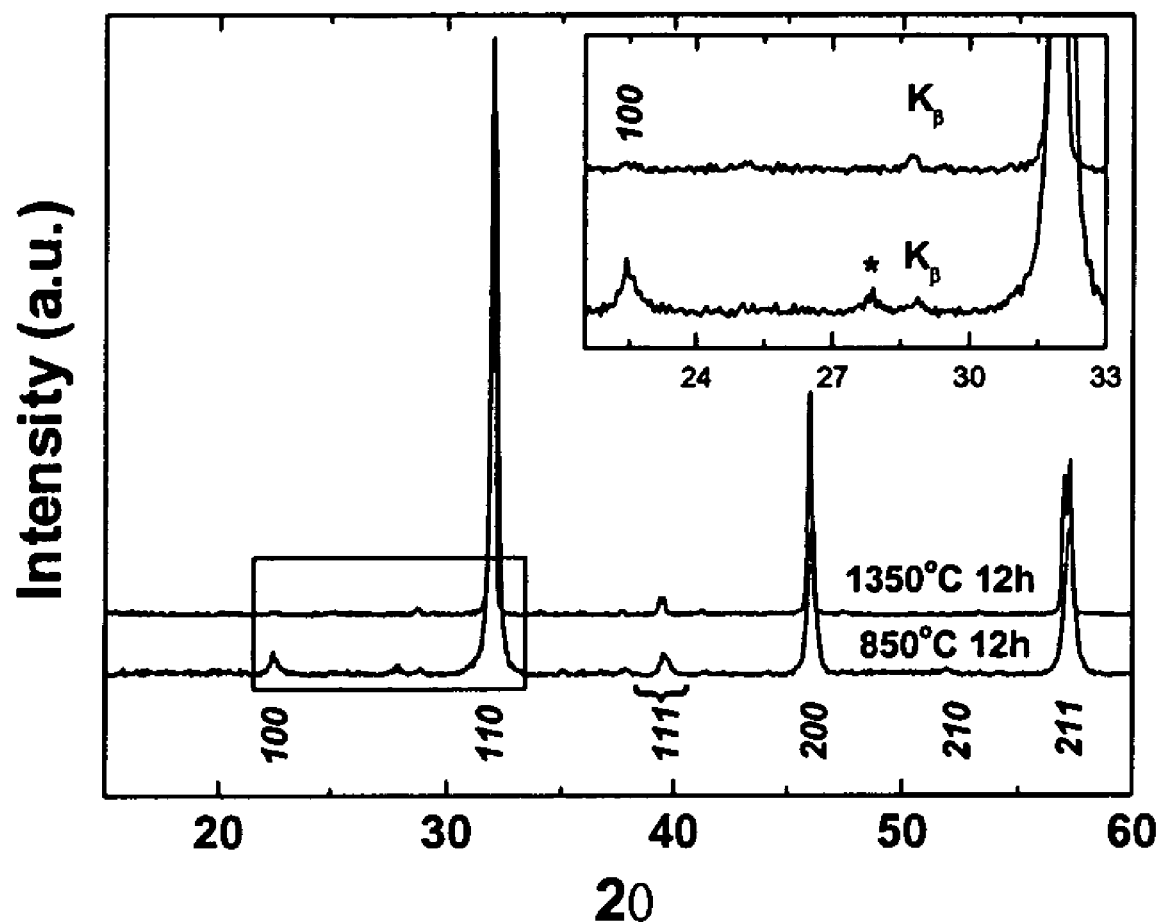
FIG. 13 graphically displays an XRD measurement of an exemplary material, $Sr_{0.7}La_{0.3}Ru_{0.7}Fe_{0.3}O_3$, prepared by solution-polymerization Process (B). * marks $RuO_2$ and SrO; $K_\beta$ marks 110 reflection from the $CuK_\beta$ line.

As was the case of the pure compound, $SrRuO_3$, the mixed ruthenate compound, $Sr_{0.7}La_{0.3}R_{0.7}Fe_{0.3}O_3$, prepared by the ceramic route suffered from slow reaction kinetics. For example, after 48 hours at 1350° C., intermediate compounds still remained. Indeed, even the majority perovskite phase appeared to have non-uniform composition. Evidence of the latter came from the intensity of (100) reflection (in simple cubic notation), which should be very weak in a random solid solution of the $Sr_{0.7}La_{0.3}Ru_{0.7}Fe_{0.3}O_3$ composition, but prominent in $SrRuO_3$ (see FIGS. 10 and 11). By comparison, Process (B) yielded a single phase material after two-step calcination as shown in FIG. 13.

The solid solution $Sr_{0.7}La_{0.3}Ru_{0.7}Fe_{0.3}O_3$ is a spin glass that shows a very large magnetoresistance at low temperatures (Mamchik et al., *Appl. Phys. Lett.* 82:613–615 (2003)). It is known that a spin glass has a very small magnetization if it is compositionally homogeneous. Conversely, any magnetic impurity phases or compositional inhomogeneities should manifest themselves in magnetic measurements, even though they may be otherwise structurally similar to the majority phase or too small (or too few) to be detected by XRD. Therefore, this material is an excellent model for comparing different processing methods.

Figure 14:
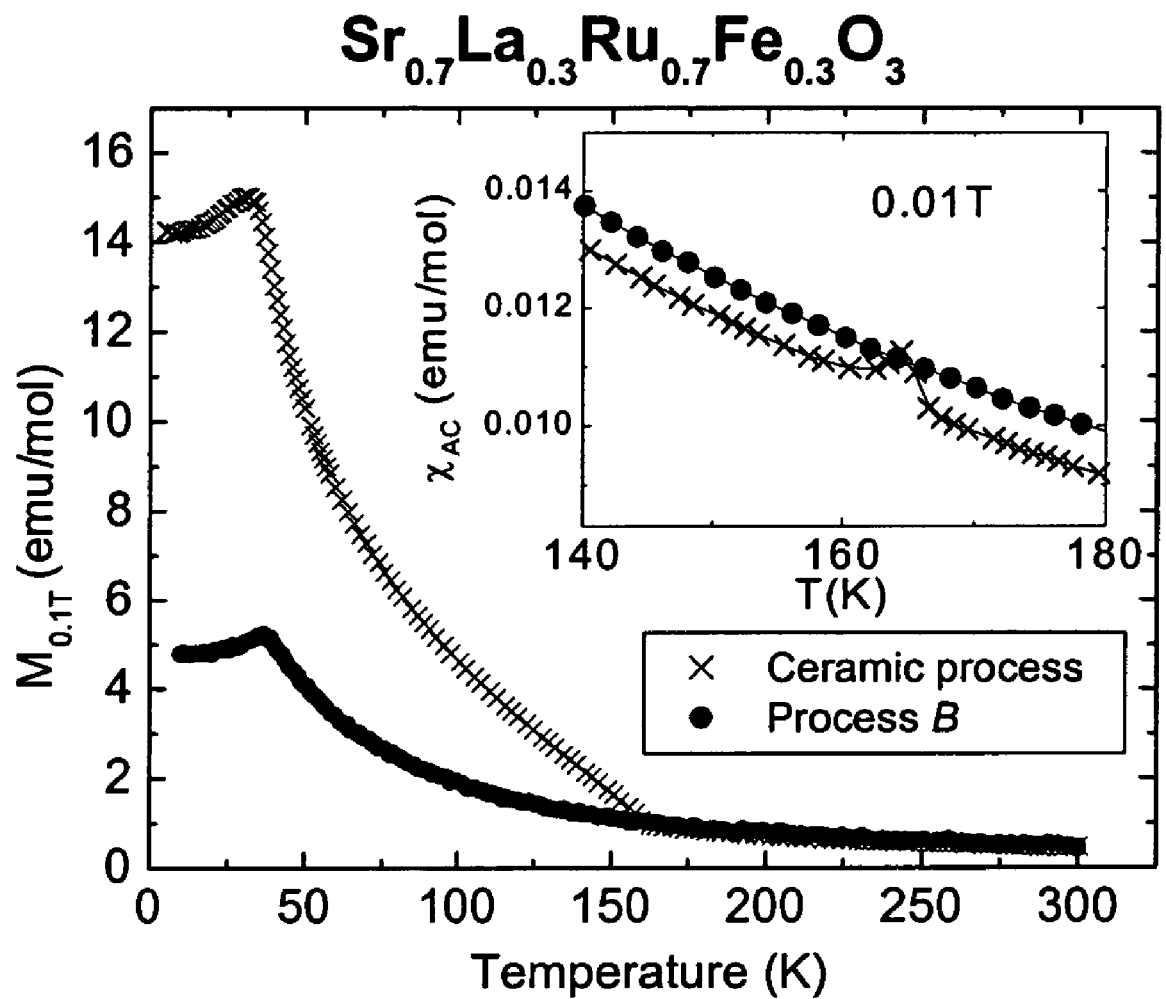
FIG. 14 graphically displays DC magnetization at 0.1 T (tesla) as a function of temperature of an exemplary material, $Sr_{0.7}La_{0.3}Ru_{0.7}Fe_{0.3}O_3$, prepared by the ceramic route and the solution-polymerization process (B), respectively. Inset shows AC susceptibility with a peak at the $T_c$ of $SrRuO_3$ clusters.

In FIG. 14, the DC magnetization curves of the $Sr_{0.7}La_{0.3}Ru_{0.7}Fe_{0.3}O_3$ sample prepared by the ceramic method, and by the solution-polymerization Process (B), respectively, are compared. There is clearly a much larger magnetization shown in the sample prepared by the ceramic process. The extraneous magnetization appears below 160K, which suggests that it could come from the ferromagnetic contribution of $SrRuO_3$ ($T_c$=160K). The presence of $SrRuO_3$ is confirmed by the weak-field AC susceptibility data (see the inset of FIG. 14) showing a ferromagnetic peak at 160K. Notably the $SrRuO_3$ phase was not detected in the XRD measurement according to FIG. 13, judging from the absence of (100) reflection after 48 hours at 1350° C. Therefore, it probably only exists as nano-sized clusters whose XRD reflections are obscured by line broadening and virtually undetectable by conventional XRD techniques.

In sum, compared to solid state reactions using mixed starting oxides, the solution-polymerization method significantly decreases the processing time and improves the compositional uniformity of the ruthenate compounds as verified by XRD and magnetic measurements. The method especially offers a clear advantage in processing doped ruthenate compounds, allowing magnetic properties of new ruthenates to be sensitively studied without the complication of impurity phases or inhomogeneous clusters.

The disclosures of each patent, patent application and publication cited or described in this document are hereby incorporated herein by reference, in their entirety.

While the foregoing specification has been described with regard to certain preferred embodiments, and many details have been set forth for the purpose of illustration, it will be apparent to those skilled in the art without departing from the spirit and scope of the invention, that the invention may be subject to various modifications and additional embodiments, and that certain of the details described herein can be varied considerably without departing from the basic principles of the invention. Such modifications and additional embodiments are also intended to fall within the scope of the appended claims.

What is claimed is:

1. A switching device comprising:
a magnetoresistive material formed from a ruthenate formulation of a perovskite family of materials; and
plurality of contact points;
wherein said magnetoresistive material exhibits an electric-pulse-induced resistance (EPIR) switching effect;
wherein said ruthenate formulation comprises an oxide formulation represented by $A(Ru_{1-x}M_x)O_3$, where $0.01<x<0.5$; M is selected from the group consisting of Ti, V, Cr, Mn, Fe, Co and Ni, as well as any mixture thereof; and A is selected from the group consisting of K, Ca, Sr, Ba, Pb, Bi, La, Ce, Pr, Nd, Pm, Sm, Eu, Gd, Tb and Y, as well as any mixture thereof;
wherein elements selected from the group consisting of Sc, Y, Zr, Nb, Hf, Ta, Al, Ga, Ge and Sn are incorporated into M in minority to vary the magnitude of electrical resistance.

2. A switching device comprising:
a magnetoresistive material formed from a ruthenate formulation of a perovskite family of materials; and
plurality of contact points;
wherein said magnetoresistive material exhibits an electric-pulse-induced resistance (EPIR) switching effect;
wherein said ruthenate formulation comprises an oxide formulation of $(Sr_{0.7}La_{0.3})(Ru_{0.7}Fe_{0.3})O_3$ or $(Sr_{0.8}La_{0.2})(Ru_{0.8}Fe_{0.2})O_3$.

3. The device of claim 2, wherein Fe is replaced by Co.

4. The device of claim 2, wherein Sr is replaced by Ca.

5. A switching device comprising:
a magnetoresistive material formed from a ruthenate formulation of a perovskite family of materials; and
plurality of contact points;
wherein said magnetoresistive material exhibits an electric-pulse-induced resistance (EPIR) switching effect;
wherein said ruthenate formulation further comprises a spin glass formulation represented $A_{n+1}(Ru_{1-x}M_x)_n O_{3n+1}$, where n is any positive integer, $0.01<x<0.5$, M is selected from the group consisting of Ti, V, Cr, Mn, Fe, Co and Ni, as well as any mixture thereof; and A is selected from the group consisting of K, Ca, Sr, Ba, Pb, Bi, La, Ce, Pr, Nd, Pm, Sm, Eu, Gd, Tb and Y, as well as any mixture thereof;
wherein elements selected from the group consisting of Sc, Y, Zr, Nb, Hf, Ta, Al, Ga, Ge and Sn are incorporated into M in minority to vary the magnitude of electrical resistance.

6. A switching device comprising:
a magnetoresistive material formed from a ruthenate formulation of a perovskite family of materials; and
plurality of contact points;
wherein said magnetoresistive material exhibits an electric-pulse-induced resistance (EPIR) switching effect;
wherein said ruthenate formulation further comprises a spin glass formulation comprising $Sr_{1.8}La_{0.2}Ru_{0.8}Fe_{0.2}O_4$.

7. The device of claim 6, wherein Fe is replaced by Co.

8. The device of claim 6, wherein Sr is replaced by Ca.

9. A method for performing electric-pulse-induced resistance (EPIR) switching comprising:
depositing a magnetoresistive material formed from a ruthenate formulation of a perovskite family of material on a substrate, wherein said magnetoresistive material exhibits an electric-pulse-induced resistance (EPIR) switching effect; and
creating an electric-pulse-induced resistance switching effect by applying a field to said electrical contacts.

10. The method as set forth in claim 9, wherein said magnetoresistive material has a magnetoresistance (MR) effect of about 18% or more.

11. The method as set forth in claim 9, wherein said EPIR switching effect occurs at room temperature.

12. The method of claim 9, wherein said ruthenate formulation comprises an oxide formulation represented by $A(Ru_{1-x}M_x)O_3$, where $0.01<x<0.5$, M is selected from the group consisting of magnetic elements; A is selected from the group consisting of K, Ca, Sr, Ba, Pb, Bi, La, Ce, Pr, Nd, Pm, Sm, Eu, Gd, Tb and Y, as well as any mixture thereof.

13. The method of claim 12, wherein the magnetic elements M are selected from the group consisting of Ti, V, Cr, Mn, Fe, Co and Ni, as well as any mixture thereof.

14. The method of claim 13, wherein elements selected from the group consisting of Sc, Y, Zr, Nb, Hf, Ta, Al, Ga, Ge and Sn are incorporated into M in minority to vary the magnitude of electrical resistance.

15. The method of claim 13, wherein M is further selected from the group consisting of Cr, Mn, Fe, Co and Ni.

16. The method of claim 15, wherein M is further selected from Fe or Co.

17. The method of claim 16, wherein said oxide formulation is $(Sr_{0.7}La_{0.3})(Ru_{0.7}Fe_{0.3})O_3$ or $(Sr_{0.8}La_{0.2})(Ru_{0.8}Fe_{0.2})O_3$.

18. The method of claim 17, wherein Fe is replaced by Co.

19. The method of claim 17, wherein Sr is replaced by Ca.

20. The method of claim 9, wherein said ruthenate formulation further comprises a spin glass formulation represented $A_{n+1}(RU_{1-x}M_x)_nO_{3n+1}$, where n is any positive integer, $0.01<x<0.5$, M is selected from the group consisting of magnetic elements; A is selected from the group consisting of K, Ca, Sr, Ba, Pb, Bi, La, Ce, Pr, Nd, Pm, Sm, Eu, Gd, Tb and Y, as well as any mixture thereof.

21. The method of claim 20, wherein said ruthenate formulation is represented by $A_2(Ru_{1-x}M_x)O_4$.

22. The method of claim 20, wherein the magnetic elements M are selected from the group consisting of Ti, V, Cr, Mn, Fe, Co and Ni, as well as any mixture thereof.

23. The method of claim 22, wherein elements selected from the group consisting of Sc, Y, Zr, Nb, Hf, Ta, Al, Ga, Ge and Sn are incorporated into M in minority to vary the magnitude of electrical resistance.

24. The method of claim 22, wherein M is further selected from the group consisting of Cr, Mn, Fe, Co and Ni.

25. The method of claim 24, wherein M is further selected from Fe or Co.

26. The method of claim 25, wherein said ruthenate is $Sr_{1.8}La_{0.2}Ru_{0.8}Fe_{0.2}O_4$.

27. The method of claim 26, wherein Fe is replaced by Co.

28. The method of claim 26, wherein Sr is replaced by Ca.

* * * * *

UNITED STATES PATENT AND TRADEMARK OFFICE
CERTIFICATE OF CORRECTION

PATENT NO.        : 7,211,199 B2                                Page 1 of 1
APPLICATION NO.   : 10/390362
DATED             : May 1, 2007
INVENTOR(S)       : I-Wei Chen et al.

It is certified that error appears in the above-identified patent and that said Letters Patent is hereby corrected as shown below:

On the cover page, at (74) Attorney, Agent, or Firm replace "Evely H. McConathy, Esq.: Montgomery, McCracked, Walker & Rhoads, LLP" with -- Evelyn H. McConathy, Esq.: Montgomery, McCracken, Walker & Rhoads, LLP--

Signed and Sealed this

Seventh Day of August, 2007

JON W. DUDAS
*Director of the United States Patent and Trademark Office*